US009755398B2

(12) United States Patent
Sztein et al.

(10) Patent No.: US 9,755,398 B2
(45) Date of Patent: *Sep. 5, 2017

(54) METHOD FOR MANUFACTURING GALLIUM AND NITROGEN BEARING LASER DEVICES WITH IMPROVED USAGE OF SUBSTRATE MATERIAL

(71) Applicant: Soraa Laser Diode, Inc., Goleta, CA (US)

(72) Inventors: Alexander Sztein, Santa Barbara, CA (US); Melvin McLaurin, Santa Barbara, CA (US); Po Shan Hsu, Arcadia, CA (US); James W. Raring, Santa Barbara, CA (US)

(73) Assignee: Soraa Laser Diode, Inc., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/173,441

(22) Filed: Jun. 3, 2016

(65) Prior Publication Data
US 2016/0359294 A1    Dec. 8, 2016

Related U.S. Application Data

(63) Continuation of application No. 14/176,403, filed on Feb. 10, 2014, now Pat. No. 9,362,715.

(51) Int. Cl.
*H01L 21/00* (2006.01)
*H01S 5/02* (2006.01)
(Continued)

(52) U.S. Cl.
CPC .......... *H01S 5/0203* (2013.01); *H01S 5/0202* (2013.01); *H01S 5/0205* (2013.01);
(Continued)

(58) Field of Classification Search
USPC .............. 438/33, 68, 113, 460, 458, 91, 237
See application file for complete search history.

(56) References Cited

U.S. PATENT DOCUMENTS

| 4,341,592 A | 7/1982 | Shortes et al. |
| 4,860,687 A | 8/1989 | Frijlink |

(Continued)

FOREIGN PATENT DOCUMENTS

| JP | 2007-173467 A1 | 7/2007 |
| JP | 2007-068398 | 4/2008 |
| WO | 2008-041521 A1 | 4/2008 |

OTHER PUBLICATIONS

Abare "Cleaved and Etched Facet Nitride Laser Diodes," IEEE Journal of Selected Topics in Quantum Electronics, vol. 4, No. 3, pp. 505-509 (May 1998).
(Continued)

*Primary Examiner* — Timor Karimy
(74) *Attorney, Agent, or Firm* — Kilpatrick Townsend & Stockton LLP

(57) ABSTRACT

In an example, the present invention provides a method for manufacturing a gallium and nitrogen containing laser diode device. The method includes providing a gallium and nitrogen containing substrate having a surface region and forming epitaxial material overlying the surface region, the epitaxial material comprising an n-type cladding region, an active region comprising of at least one active layer overlying the n-type cladding region, and a p-type cladding region overlying the active layer region. The method includes patterning the epitaxial material to form a plurality of dice, each of the dice corresponding to at least one laser device, characterized by a first pitch between a pair of dice, the first pitch being less than a design width. The method includes transferring each of the plurality of dice to a carrier wafer such that each pair of dice is configured with a second
(Continued)

State of the Art Laser Diode

Conventional Laser Die Pitch on Epitaxial Wwafer pitch between each pair of dice, the second pitch being larger than the first pitch corresponding to the design width.

20 Claims, 11 Drawing Sheets

(51) Int. Cl.
*H01S 5/022* (2006.01)
*H01S 5/32* (2006.01)
*H01S 5/343* (2006.01)

(52) U.S. Cl.
CPC .......... *H01S 5/0215* (2013.01); *H01S 5/0217* (2013.01); *H01S 5/0224* (2013.01); *H01S 5/3202* (2013.01); *H01S 5/34333* (2013.01); *H01S 5/34346* (2013.01)

(56) References Cited

U.S. PATENT DOCUMENTS

| | | |
|---|---|---|
| 4,911,102 A | 3/1990 | Manabe et al. |
| 5,331,654 A | 7/1994 | Jewell et al. |
| 5,334,277 A | 8/1994 | Nakamura |
| 5,366,953 A | 11/1994 | Char et al. |
| 5,474,021 A | 12/1995 | Tsuno et al. |
| 5,527,417 A | 6/1996 | Lida et al. |
| 5,562,127 A | 10/1996 | Fanselow et al. |
| 5,607,899 A | 3/1997 | Yoshida et al. |
| 5,632,812 A | 5/1997 | Hirabayashi |
| 5,696,389 A | 12/1997 | Ishikawa et al. |
| 5,821,555 A | 10/1998 | Saito et al. |
| 5,888,907 A | 3/1999 | Tomoyasu et al. |
| 5,926,493 A | 7/1999 | O'Brien et al. |
| 5,951,923 A | 9/1999 | Rorie et al. |
| 5,985,687 A | 11/1999 | Bowers et al. |
| 6,069,394 A | 5/2000 | Hashimoto et al. |
| 6,147,953 A | 11/2000 | Duncan |
| 6,153,010 A | 11/2000 | Kiyoku et al. |
| 6,239,454 B1 | 5/2001 | Glew et al. |
| 6,379,985 B1 | 4/2002 | Cervantes et al. |
| 6,451,157 B1 | 9/2002 | Hubacek |
| 6,489,636 B1 | 12/2002 | Goetz et al. |
| 6,562,127 B1 | 5/2003 | Kud et al. |
| 6,586,762 B2 | 7/2003 | Kozaki |
| 6,635,904 B2 | 10/2003 | Goetz et al. |
| 6,680,959 B2 | 1/2004 | Tanabe et al. |
| 6,734,461 B1 | 5/2004 | Shiomi et al. |
| 6,755,932 B2 | 6/2004 | Masuda et al. |
| 6,809,781 B2 | 10/2004 | Setlur et al. |
| 6,814,811 B2 | 11/2004 | Ose |
| 6,833,564 B2 | 12/2004 | Shen et al. |
| 6,858,081 B2 | 2/2005 | Biwa et al. |
| 6,920,166 B2 | 7/2005 | Akasaka et al. |
| 7,009,199 B2 | 3/2006 | Hall |
| 7,033,858 B2 | 4/2006 | Chai et al. |
| 7,053,413 B2 | 5/2006 | D'Evelyn et al. |
| 7,063,741 B2 | 6/2006 | D'Evelyn |
| 7,128,849 B2 | 10/2006 | Setlur et al. |
| 7,220,324 B2 | 5/2007 | Baker et al. |
| 7,303,630 B2 | 12/2007 | Motoki et al. |
| 7,312,156 B2 | 12/2007 | Granneman et al. |
| 7,323,723 B2 | 1/2008 | Ohtsuka et al. |
| 7,338,828 B2 | 3/2008 | Imer et al. |
| 7,358,542 B2 | 4/2008 | Radkov et al. |
| 7,358,543 B2 | 4/2008 | Chua et al. |
| 7,390,359 B2 | 6/2008 | Miyanaga et al. |
| 7,470,555 B2 | 12/2008 | Matsumura |
| 7,483,466 B2 | 1/2009 | Uchida et al. |
| 7,489,441 B2 | 2/2009 | Scheible et al. |
| 7,555,025 B2 | 6/2009 | Yoshida |
| 7,691,658 B2 | 4/2010 | Kaeding et al. |
| 7,727,332 B2 | 6/2010 | Habel et al. |
| 7,733,571 B1 | 6/2010 | Li |
| 7,749,326 B2 | 7/2010 | Kim et al. |
| 7,806,078 B2 | 10/2010 | Yoshida |
| 7,858,408 B2 | 12/2010 | Mueller et al. |
| 7,862,761 B2 | 1/2011 | Okushima et al. |
| 7,923,741 B1 | 4/2011 | Zhai et al. |
| 7,939,354 B2 | 5/2011 | Kyono et al. |
| 7,968,864 B2 | 6/2011 | Akita et al. |
| 8,017,932 B2 | 9/2011 | Okamoto et al. |
| 8,044,412 B2 | 10/2011 | Murphy et al. |
| 8,143,148 B1 | 3/2012 | Raring et al. |
| 8,247,887 B1 | 8/2012 | Raring et al. |
| 8,252,662 B1 | 8/2012 | Poblenz et al. |
| 8,259,769 B1 | 9/2012 | Raring et al. |
| 8,314,429 B1 | 11/2012 | Raring et al. |
| 8,351,478 B2 | 1/2013 | Raring et al. |
| 8,355,418 B2 | 1/2013 | Raring et al. |
| 8,422,525 B1 | 4/2013 | Raring et al. |
| 9,246,311 B1 | 1/2016 | Raring et al. |
| 9,362,715 B2 | 6/2016 | Sztein et al. |
| 9,368,939 B2 | 6/2016 | McLaurin et al. |
| 9,379,525 B2 | 6/2016 | McLaurin et al. |
| 9,520,695 B2 | 12/2016 | Hsu et al. |
| 9,520,697 B2 | 12/2016 | Steigerwald et al. |
| 9,653,642 B1 | 5/2017 | Raring et al. |
| 9,666,677 B1 | 5/2017 | Raring et al. |
| 9,711,949 B1 | 7/2017 | Raring et al. |
| 2002/0050488 A1 | 5/2002 | Nikitin et al. |
| 2002/0085603 A1 | 7/2002 | Okumura |
| 2002/0171092 A1 | 11/2002 | Goetz et al. |
| 2003/0000453 A1 | 1/2003 | Unno et al. |
| 2003/0001238 A1 | 1/2003 | Ban |
| 2003/0012243 A1 | 1/2003 | Okumura |
| 2003/0020087 A1 | 1/2003 | Goto et al. |
| 2003/0140846 A1 | 7/2003 | Biwa et al. |
| 2003/0216011 A1 | 11/2003 | Nakamura et al. |
| 2004/0025787 A1 | 2/2004 | Selbrede et al. |
| 2004/0060518 A1 | 4/2004 | Nakamura et al. |
| 2004/0104391 A1 | 6/2004 | Maeda et al. |
| 2004/0112866 A1 | 6/2004 | Maleville et al. |
| 2004/0151222 A1 | 8/2004 | Sekine |
| 2004/0196877 A1 | 10/2004 | Kawakami et al. |
| 2004/0209402 A1 | 10/2004 | Chai et al. |
| 2004/0222357 A1 | 11/2004 | King et al. |
| 2004/0247275 A1 | 12/2004 | Vakhshoori et al. |
| 2004/0259331 A1 | 12/2004 | Ogihara et al. |
| 2004/0262624 A1 | 12/2004 | Akita et al. |
| 2005/0040384 A1 | 2/2005 | Tanaka et al. |
| 2005/0072986 A1 | 4/2005 | Sasaoka |
| 2005/0158896 A1 | 7/2005 | Hayashi et al. |
| 2005/0168564 A1 | 8/2005 | Kawaguchi et al. |
| 2005/0199893 A1 | 9/2005 | Lan et al. |
| 2005/0224826 A1 | 10/2005 | Keuper et al. |
| 2005/0229855 A1 | 10/2005 | Raaijmakers |
| 2005/0285128 A1 | 12/2005 | Scherer et al. |
| 2006/0030738 A1 | 2/2006 | Vanmaele et al. |
| 2006/0037529 A1 | 2/2006 | D'Evelyn |
| 2006/0038193 A1 | 2/2006 | Wu et al. |
| 2006/0060131 A1 | 3/2006 | Atanackovic |
| 2006/0066319 A1 | 3/2006 | Dallenbach et al. |
| 2006/0078022 A1 | 4/2006 | Kozaki et al. |
| 2006/0079082 A1 | 4/2006 | Bruhns et al. |
| 2006/0086319 A1 | 4/2006 | Kasai et al. |
| 2006/0110926 A1 | 5/2006 | Hu et al. |
| 2006/0118799 A1 | 6/2006 | D'Evelyn et al. |
| 2006/0126688 A1 | 6/2006 | Kneissl |
| 2006/0144334 A1 | 7/2006 | Yim et al. |
| 2006/0175624 A1 | 8/2006 | Sharma et al. |
| 2006/0189098 A1 | 8/2006 | Edmond |
| 2006/0193359 A1 | 8/2006 | Kuramoto |
| 2006/0205199 A1 | 9/2006 | Baker et al. |
| 2006/0216416 A1 | 9/2006 | Sumakeris et al. |
| 2006/0256482 A1 | 11/2006 | Araki et al. |
| 2006/0288928 A1 | 12/2006 | Eom et al. |
| 2007/0081857 A1 | 4/2007 | Yoon |
| 2007/0086916 A1 | 4/2007 | LeBoeuf et al. |
| 2007/0093073 A1 | 4/2007 | Farrell et al. |
| 2007/0109463 A1 | 5/2007 | Hutchins |
| 2007/0110112 A1 | 5/2007 | Sugiura |
| 2007/0120141 A1 | 5/2007 | Moustakas et al. |
| 2007/0163490 A1 | 7/2007 | Habel et al. |

(56) References Cited

U.S. PATENT DOCUMENTS

| | | |
|---|---|---|
| 2007/0166853 A1 | 7/2007 | Guenther et al. |
| 2007/0217462 A1 | 9/2007 | Yamasaki |
| 2007/0242716 A1 | 10/2007 | Samal et al. |
| 2007/0252164 A1 | 11/2007 | Zhong et al. |
| 2007/0280320 A1 | 12/2007 | Feezell et al. |
| 2008/0087919 A1 | 4/2008 | Tysoe et al. |
| 2008/0092812 A1 | 4/2008 | McDiarmid et al. |
| 2008/0095492 A1 | 4/2008 | Son et al. |
| 2008/0121916 A1 | 5/2008 | Teng et al. |
| 2008/0124817 A1 | 5/2008 | Bour et al. |
| 2008/0138919 A1 | 6/2008 | Mueller et al. |
| 2008/0149949 A1 | 6/2008 | Nakamura et al. |
| 2008/0149959 A1 | 6/2008 | Nakamura et al. |
| 2008/0164578 A1 | 7/2008 | Tanikella et al. |
| 2008/0173735 A1 | 7/2008 | Mitrovic et al. |
| 2008/0191192 A1 | 8/2008 | Feezell et al. |
| 2008/0191223 A1 | 8/2008 | Nakamura et al. |
| 2008/0198881 A1 | 8/2008 | Farrell et al. |
| 2008/0210958 A1 | 9/2008 | Senda et al. |
| 2008/0217745 A1 | 9/2008 | Miyanaga et al. |
| 2008/0219309 A1 | 9/2008 | Hata et al. |
| 2008/0232416 A1 | 9/2008 | Okamoto et al. |
| 2008/0285609 A1 | 11/2008 | Ohta et al. |
| 2008/0291961 A1 | 11/2008 | Kamikawa et al. |
| 2008/0303033 A1 | 12/2008 | Brandes |
| 2008/0308815 A1 | 12/2008 | Kasai et al. |
| 2008/0315179 A1 | 12/2008 | Kim et al. |
| 2009/0058532 A1 | 3/2009 | Kikkawa et al. |
| 2009/0078944 A1 | 3/2009 | Kubota et al. |
| 2009/0080857 A1 | 3/2009 | St. John-Larkin |
| 2009/0081857 A1 | 3/2009 | Hanser et al. |
| 2009/0081867 A1 | 3/2009 | Taguchi et al. |
| 2009/0141765 A1 | 6/2009 | Kohda et al. |
| 2009/0159869 A1 | 6/2009 | Ponce et al. |
| 2009/0173957 A1 | 7/2009 | Brunner et al. |
| 2009/0229519 A1 | 9/2009 | Saitoh |
| 2009/0250686 A1 | 10/2009 | Sato et al. |
| 2009/0267100 A1 | 10/2009 | Miyake et al. |
| 2009/0273005 A1 | 11/2009 | Lin |
| 2009/0291518 A1 | 11/2009 | Kim et al. |
| 2009/0298265 A1 | 12/2009 | Fujiwara |
| 2009/0301387 A1 | 12/2009 | D'Evelyn |
| 2009/0301388 A1 | 12/2009 | D'Evelyn |
| 2009/0309110 A1 | 12/2009 | Raring et al. |
| 2009/0309127 A1 | 12/2009 | Raring et al. |
| 2009/0320744 A1 | 12/2009 | D'Evelyn |
| 2009/0321778 A1 | 12/2009 | Chen et al. |
| 2010/0001300 A1 | 1/2010 | Raring et al. |
| 2010/0003492 A1 | 1/2010 | D'Evelyn |
| 2010/0006873 A1 | 1/2010 | Raring et al. |
| 2010/0025656 A1 | 2/2010 | Raring et al. |
| 2010/0031875 A1 | 2/2010 | D'Evelyn |
| 2010/0044718 A1 | 2/2010 | Hanser et al. |
| 2010/0096615 A1 | 4/2010 | Okamoto et al. |
| 2010/0104495 A1 | 4/2010 | Kawabata et al. |
| 2010/0140745 A1 | 6/2010 | Khan et al. |
| 2010/0151194 A1 | 6/2010 | D'Evelyn |
| 2010/0195687 A1 | 8/2010 | Okamoto et al. |
| 2010/0220262 A1 | 9/2010 | DeMille et al. |
| 2010/0295054 A1 | 11/2010 | Okamoto et al. |
| 2010/0302464 A1 | 12/2010 | Raring et al. |
| 2010/0309943 A1 | 12/2010 | Chakraborty et al. |
| 2010/0316075 A1 | 12/2010 | Raring et al. |
| 2010/0327291 A1 | 12/2010 | Preble et al. |
| 2011/0044022 A1 | 2/2011 | Ko et al. |
| 2011/0056429 A1 | 3/2011 | Raring et al. |
| 2011/0057167 A1 | 3/2011 | Ueno et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0075694 A1 | 3/2011 | Yoshizumi et al. |
| 2011/0103418 A1 | 5/2011 | Hardy et al. |
| 2011/0133489 A1 | 6/2011 | Hemeury et al. |
| 2011/0164637 A1 | 7/2011 | Yoshizumi et al. |
| 2011/0164646 A1 | 7/2011 | Maeda et al. |
| 2011/0180781 A1 | 7/2011 | Raring et al. |
| 2011/0186874 A1 | 8/2011 | Shum |
| 2011/0186887 A1 | 8/2011 | Trottier et al. |
| 2011/0204376 A1 | 8/2011 | Su et al. |
| 2011/0216795 A1 | 9/2011 | Hsu et al. |
| 2011/0247556 A1 | 10/2011 | Raring et al. |
| 2012/0178198 A1 | 7/2012 | Raring et al. |
| 2012/0187412 A1 | 7/2012 | D'Evelyn et al. |
| 2012/0314398 A1 | 12/2012 | Raring et al. |
| 2013/0214284 A1 | 8/2013 | Holder et al. |
| 2013/0234111 A1 | 9/2013 | Pfister et al. |
| 2014/0023102 A1 | 1/2014 | Holder et al. |
| 2015/0111325 A1 | 4/2015 | Hsu et al. |
| 2015/0140710 A1 | 5/2015 | McLaurin et al. |
| 2015/0229100 A1 | 8/2015 | Sztein et al. |
| 2015/0229107 A1 | 8/2015 | McLaurin et al. |
| 2015/0229108 A1 | 8/2015 | Steigerwald et al. |
| 2016/0294162 A1 | 10/2016 | Mclaurin et al. |
| 2016/0372893 A1 | 12/2016 | Mclaurin et al. |
| 2017/0063045 A1 | 3/2017 | McLaurin et al. |
| 2017/0063047 A1 | 3/2017 | Steigerwald et al. |
| 2017/0077677 A1 | 3/2017 | Hsu et al. |

OTHER PUBLICATIONS

Aoki et al., "InGaAs/InGaAsP MQW Electroabsorption Modulator Integrated with a DFB Laser Fabricated by Band-Gap Energy Control Selective Area MOCVD, 1993," IEEE J Quantum Electronics, vol. 29, pp. 2088-2096.

Asano et al., "100-mW kink-Free Blue-Violet Laser Diodes with Low Aspect Ratio," 2003, IEEE Journal of Quantum Electronics, vol. 39, No. 1, pp. 135-140.

Asif Khan "Cleaved cavity optically pumped InGaN-GaN laser grown on spinel substrates," Appl. Phys. Lett. 69 (16), pp. 2418-2420 (Oct. 14, 1996).

Bernardini et al., "Spontaneous Polarization and Piezoelectric Constants of III-V Nitrides," 1997, Physical Review B, vol. 56, No. 16, pp. 10024-10027.

Caneau et al., "Studies on Selective OMVPE of (Ga,In)/(As,P)," 1992, Journal of Crystal Growth, vol. 124, pp. 243-248.

Chen et al., "Growth and Optical Properties of Highly Uniform and Periodic InGaN Nanostructures," 2007, Advanced Materials, vol. 19, pp. 1707-1710.

D'Evelyn et al., "Bulk GaN Crystal Growth by the High-Pressure Ammonothermal Method," Journal of Crystal Growth, 2007, vol. 300, pp. 11-16.

Founta et al., 'Anisotropic Morphology of Nonpolar a-Plane GaN Quantum Dots and Quantum Wells,' Journal of Applied Physics, vol. 102, vol. 7, 2007, pp. 074304-1-074304-6.

Fujii et al., "Increase in the Extraction Efficiency of GaN-based Light-Emitting Diodes Via Surface Roughening," 2004, Applied Physics Letters, vol. 84, No. 6, pp. 855-857.

Funato et al., "Blue, Green, and Amber InGaN/GaN Light-Emitting Diodes on Semipolar (1122) GaN Substrates," 2006, Journal of Japanese Applied Physics, vol. 45, No. 26, pp. L659-L662.

Funato et al., "Monolithic Polychromatic Light-Emitting Diodes Based on InGaN Microfacet Quantum Wells toward Tailor-Made Solid-State Lighting," 2008, Applied Physics Express, vol. 1, pp. 011106-1-011106-3.

Gallium nitride, retrieved from http://en.wikipedia.org/wiki/Gallium_nitride on Dec. 31, 2014, 6 pages.

Gardner et al. "Blue-emitting InGaN-GaN double-heterostructure light-emitting diodes reaching maximum quantum efficiency above 200 A/ cm2", Applied Physics Letters 91, 243506 (2007).

Amano et al., "P-type conduction in Mg-doped GaN treated with low-energy electron beam irradiation (LEEBI)," Jpn. J. Appl. Phys. vol. 28, pp. L2112-L2114, 1989.

hap ://techon.nikkeibp. co jp/english/NEWS_EN/20080122/146009.

Hiramatsu et al., Selective Area Growth and Epitaxial Lateral Overgrowth of GaN by Metalorganic Vapor Phase Epitaxy and Hydride Vapor Phase Epitaxy. Materials Science and Engineering B, vol. 59, May 6, 1999. pp. 104-111.

(56) References Cited

OTHER PUBLICATIONS

Hjort, K., "Sacrificial etching of III-V compounds for micromechanical devices," J. Micromech. Microeng., 6 (1996), pp. 370-375.

Holder et al., "Demonstration of Nonpolar GaN-Based Vertical-Cavity Surface-Emitting Lasers," Appl. Phys. Express 5, 092104 (2012).

International Search Report & Written Opinion of PCT Application No. PCT/US2010/049172, dated Nov. 17, 2010, 7 pages.

International Search Report & Written Opinion ofPCT Application No. PCT/US2010/030939, dated Jun. 16, 2010, 9 pages.

International Search Report and Written Opinion of the International Searching Authority for PCT/US15/14567 mailed Jul. 8, 2015, 23 pages.

International Search Report of PCT Application No. PCT/US2009/046786, dated May 13, 2010, 2 pages.

International Search Report of PCT Application No. PCT/US2009/047107, dated Sep. 29, 2009, 4 pages.

International Search Report of PCT Application No. PCT/US2009/52611, dated Sep. 29, 2009, 3 pages.

International Search Report of PCT Application No. PCT/US2011/037792, dated Sep. 8, 2011, 2 pages.

International Searching Authority Communication for PCT Application No. PCT/US15/14567 mailed May 1, 2015, 2 pages.

Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.

Kendall et al., "Energy Savings Potential of Solid State Lighting in General Lighting Applications," 2001, Report for the Department of Energy, pp. 1-35.

Kim et al, "Improved Electroluminescence on Nonpolar m-plane InGaN/GaN Qantum Well LEDs", 2007, Physica Status Solidi (RRL), vol. 1, No. 3, pp. 125-127.

Kuramoto et al., "Novel Ridge-Type InGaN Multiple-Quantum-Well Laser Diodes Fabricated by Selective Area Re-Growth on n-GaN Substrates," 2007, Journal of Japanese Applied Physics, vol. 40, pp. 925-927.

Lidow et al., Gallium Nitride (GaN) Technology Overview, EPC White Paper, (2012) 6 pages.

Light-emitting diode, retried from http://en.wikipedia.org/wiki/Light-emitting_diode on Dec. 31, 2014, 44 pages.

Lin et al. "Influence of Separate Confinement Heterostructure Layer on Carrier Distribution in InGaAsP Laser Diodes with Nonidentical Multiple Quantum Wells," Japanese Journal of Applied Physics, vol. 43, No. 10, pp. 7032-7035 (2004).

Masui et al. "Electrical Characteristics of Nonpolar InGaN-Based Light-Emitting Diodes Evaluated at Low Temperature," Jpn. J. Appl. Phys. 46 pp. 7309-7310 (2007).

Michiue et al. "Recent development of nitride LEDs and LDs," Proceedings of SPIE, vol. 7216, 72161Z (2009).

Nakamura et al., "InGaN/Gan/AlGaN-based Laser Diodes with Modulation-doped Strained-layer Superlattices Grown on an Epitaxially Laterally Grown GaN Substrate", 1998, Applied Physics Letters, vol. 72, No. 12, pp. 211-213.

Nam et al., "Later Epitaxial Overgrowth of GaN films on SiO2 Areas Via Metalorganic Vapor Phase Epitaxy," 1998, Journal of Electronic Materials, vol. 27, No. 4, pp. 233-237.

Okamoto et al. In "High-Efficiency Continuous-Wave Operation of Blue-Green Laser Diodes Based on Nonpolar m-Plane Gallium Nitride," The Japan Society of Applied Physics, Applied Physics Express 1 (Jun. 2008).

Okamoto et al., "Pure Blue Laser Diodes Based on Nonpolar m-Plane Gallium Nitride with InGaN Waveguiding Layers," 2007, Journal of Japanese Applied Physics, vol. 46, No. 35, pp. 820-822.

Okamoto et. al "Continuous-Wave Operation of m-Plane InGaN Multiple Quantum Well Laser Diodes" The Japan Society of I Applied Physics JJAP Express LEtter, vol. 46, No. 9, 2007 pp. L 187-L 189.

Park, "Crystal orientation effects on electronic properties of wurtzite InGaN/GaN quantum wells,",Journal of Applied Physics vol. 91, No. 12, pp. 9904-9908 (Jun. 2002).

Power electronics, retrieved from http://en.wikipedia.org/wiki/Power_electronics on Dec. 31, 2014, 24 pages.

Purvis, "Changing the Crystal Face of Gallium Nitride." The Advance Semiconductor Magazine, vol. 18, No. 8, Nov. 2005.

Romanov "Strain-induced polarization in wurtzite III-nitride semipolar layers," Journal of Applied Physics 100, pp. 023522-1 through 023522-10 (Jul. 25, 2006).

Nakamura et al., "P-GaN/n-InGaN/n-GaN double-heterostructure blue-light-emitting diodes," Jpn. J. Appl. Phys., vol. 32, pp. L8-L11, 1993.

Nakamura et al., "Candela-class high-brightness InGaN/AlgaN double-heterostructure blue-light-emitting diodes," Appl. Phys. Lett., vol. 64, pp. 1687-1689, 1994.

Sato et al., "High Power and High Efficiency Green Light Emitting Diode on free-Standing Semipolar (1122) Bulk GaN Substrate," 2007.Physica Status Solidi (RRL), vol. 1, pp. 162-164.

Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.

Schmidt et al., "Demonstration of Nonpolar m-plane InGaN/GaN Laser Diodes," 2007, Journal of Japanese Applied Physics, vol. 46, No. 9, pp. 190-191.

Schmidt et al., "High Power and High External Efficiency m-plane InGaN Light Emitting Diodes," 2007, Japanese Journal of Applied Physics, vol. 46, No. 7, pp. L126-L128.

Schoedl "Facet degradation of GaN heterostructure laser diodes," Journal of Applied Physics vol. 97, issue 12, pp. 123102-1 to 123102-8 (2005).

Shchekin et al., "High Performance Thin-film Flip-Chip InGaN-GaN Light-emitting Diodes," 2006, Applied Physics Letters, vol. 89, pp. 071109-071109-3.

Shen et al. "Auger recombination in InGaN measured by photoluminescence," Applied Physics Letters, 91, 141101 (2007).

Sink, R., "Cleaved-Facet Group-III Nitride Lasers." University of California, Santa Barbara, Ph.D. Dissertation, Dec. 2000, 251 pages.

Sizov et al., "500-nm Optical Gain Anisotropy of Semipolar (1122) InGaN Quantum Wells," 2009, Applied Physics Express, vol. 2, pp. 071001-1-071001-3.

Tamboli, A. Photoelectrochemical etching of gallium nitride for high quality optical devices. (2009), 207 pages.

Tomiya et. al. Dislocation related issues in the degradation of GaN-based laser diodes, IEEE Journal of Selected Topics in Quantum Electronics vol. 10, No. 6 (2004).

Transistor, retrieved from http://en.wikipedia.org/wiki/Transistor on Dec. 31, 2014, 25 pages.

Tyagi et al., "High Brightness Violet InGaN/GaN Light Emitting Diodes on Semipolar (1011) Bulk GaN Substrates," 2007, Japanese Journal of Applied Physics, vol. 46, No. 7, pp. L129-L131.

U.S. Appl. No. 14/968,710, filed Dec. 14, 2015, Raring et al., unpublished.

U.S. Appl. No. 15/559,149, filed Jun. 9, 2016, McLaurin et al., unpublished.

Uchida et al.,"Recent Progress in High-Power Blue-violet Lasers," 2003, IEEE Journal of Selected Topics in Quantum Electronics, vol. 9, No. 5, pp. 1252-1259.

U.S. Appl. No. 12/573,820, filed Oct. 5, 2009, Raring et al., Unpublished.

U.S. Appl. No. 12/727,148, filed Mar. 18, 2010, Raring, Unpublished.

U.S. Appl. No. 12/880,889, filed Sep. 13, 2010, Raring et al., Unpublished.

U.S. Appl. No. 61/164,409, filed Mar. 28, 2009, Raring et al., Unpublished.

U.S. Appl. No. 61/182,105, filed May 29, 2009, Raring, Unpublished.

U.S. Appl. No. 61/249,568, filed Oct. 7, 2009, Raring et al. Unpublished.

Uspto Notice of Allowance for U.S. Appl. No. 12/762,278 dated Nov. 7, 2011.

(56) References Cited

OTHER PUBLICATIONS

USPTO Notice of Allowance for U.S. Appl. No. 12/497,289 dated May 22, 2012.
USPTO Notice of Allowance for U.S. Appl. No. 12/502,058 dated Apr. 16, 2012.
USPTO Notice of Allowance for U.S. Appl. No. 12/534,829 dated Dec. 5, 2011.
USPTO Notice of Allowance for U.S. Appl. No. 12/534,829 dated Dec. 21, 2011.
USPTO Notice of Allowance for U.S. Appl. No. 12/534,829 dated Oct. 28, 2011.
USPTO Notice of Allowance for U.S. Appl. No. 12/749,476 dated May 4, 2012.
USPTO Notice of Allowance for U.S. Appl. No. 12/762,269 dated Apr. 23, 2012.
USPTO Notice of Allowance for U.S. Appl. No. 12/778,718 dated Apr. 3, 2012.
USPTO Notice of Allowance for U.S. Appl. No. 12/883,093 dated Nov. 21, 2012.
USPTO Notice of Allowance for U.S. Appl. No. 12/884,993 dated Nov. 26, 2012.
USPTO Office action for U.S. Appl. No. 12/484,924 dated Oct. 31, 2011.
USPTO Office action for U.S. Appl. No. 12/497,289 dated Feb. 2, 2012.
USPTO Office action for U.S. Appl. No. 12/749,466 dated Feb. 3, 2012.
USPTO Office action for U.S. Appl. No. 12/759,273 dated Nov. 21, 2011.
USPTO Office action for U.S. Appl. No. 12/762,269 (Oct. 12, 2011).
USPTO Office action for U.S. Appl. No. 12/762,271 dated Dec. 23, 2011.
USPTO Office action for U.S. Appl. No. 12/778,718 dated Nov. 25, 2011.
USPTO Office action for U.S. Appl. No. 12/873,820 dated Oct. 11, 2012.
USPTO Office action for U.S. Appl. No. 13/046,565 dated Feb. 2, 2012.
USPTO Office action for U.S. Appl. No. 13/046,565 dated Nov. 7, 2011.
USPTO Office Action for U.S. Appl. No. 12/481,543 dated Jun. 27, 2011.
USPTO Office Action for U.S. Appl. No. 12/482,440 dated Aug. 12, 2011.
USPTO Office Action for U.S. Appl. No. 12/482,440 dated Feb. 23, 2011.
USPTO Office Action for U.S. Appl. No. 12/484,924 dated Apr. 14, 2011.
USPTO Office Action for U.S. Appl. No. 12/491,169 dated May 11, 2011.
USPTO Office Action for U.S. Appl. No. 12/491,169 dated Oct. 22, 2010.
USPTO Office Action for U.S. Appl. No. 12/502,058 dated Aug. 19, 2011.
USPTO Office Action for U.S. Appl. No. 12/502,058 dated Dec. 8, 2010.
USPTO Office Action for U.S. Appl. No. 12/534,829 dated Apr. 19, 2011.
USPTO Office Action for U.S. Appl. No. 12/573,820 dated Mar. 2, 2011.
USPTO Office Action for U.S. Appl. No. 12/573,820 dated Oct. 11, 2011.
USPTO Office Action for U.S. Appl. No. 12/749,466 dated Jun. 29, 2011.
USPTO Office Action for U.S. Appl. No. 12/749,476 dated Apr. 11, 2011.
USPTO Office Action for U.S. Appl. No. 12/749,476 dated Nov. 8, 2011.
USPTO Office Action for U.S. Appl. No. 12/762,271 dated Jun. 6, 2012.
USPTO Office Action for U.S. Appl. No. 12/868,441 dated Apr. 30, 2012.
USPTO Office Action for U.S. Appl. No. 12/880,803 dated Feb. 22, 2012.
USPTO Office Action for U.S. Appl. No. 12/883,093 dated Aug. 3, 2012.
USPTO Office Action for U.S. Appl. No. 12/883,093 dated Mar. 13, 2012.
USPTO Office Action for U.S. Appl. No. 12/883,652 dated Apr. 17, 2012.
USPTO Office Action for U.S. Appl. No. 12/884,993 dated Aug. 2, 16, 2012.
USPTO Office Action for U.S. Appl. No. 12/884,993 dated Mar. 16, 2012.
USPTO Office Action for U.S. Appl. No. 13/014,622 dated Apr. 30, 2012.
USPTO Office Action for U.S. Appl. No. 13/014,622 dated Nov. 28, 2011.
USPTO Office Action for U.S. Appl. No. 13/046,565 dated Apr. 13, 2012.
Waltereit et al., "Nitride Semiconductors Free of Electrostatic Fields for Efficient White Light-emitting Diodes," 2000, Nature: International Weekly Journal of Science, vol. 406, pp. 865-868.
Wierer et al., "High-power AlGaInN Flip-chip Light-emitting Diodes," 2001, Applied Physics Letters, vol. 78, No. 22, pp. 3379-3381.
Yamaguchi, A. Atsushi, "Anisotropic Optical Matrix Elements in Strained GaN-quantum Wells with Various Substrate Orientations," 2008, Physica Status Solidi (PSS), vol. 5, No. 6, pp. 2329-2332.
Yang, B. Micromachining of GaN Using Photoelectrochemical Etching, Graduate Program in Electronic Engineering, Notre Dame, Indiana (2005). 168 pages.
Yoshizumi et al. "Continuous-Wave operation of 520 nm Green InGaN-Based Laser Diodes on Semi-Polar {20-21} GaN Substrates," Applied Physics Express 2 (2009).
Yu et al., "Multiple Wavelength Emission from Semipolar InGaN/GaN Quantum Wells Selectively Grown by MOCVD," in Conference on Lasers and Electro-Optics/Quantum Electronics and Laser Science Conference and Photonic Applications Systems Technologies, OSA Technical Digest (CD) (Optical Society of America, 2007), paper JTuA92.
Zhong et al., "Demonstration of High Power Blue-Green Light Emitting Diode on Semipolar (1122) Bulk GaN Substrate," 2007, Electron Letter, vol. 43, No. 15, pp. 825-826.
Zhong et al., "High Power and High Efficiency Blue Light Emitting Diode on Freestanding Semipolar (1122) Bulk GaN Substrate," 2007, Applied Physics Letter, vol. 90, No. 23, pp. 233504-233504-3.
Non-Final Office Action of Sep. 11, 2015 for U.S. Appl. No. 14/176,403, 27 pages.
Restriction Requirement of May 18, 2015 for U.S. Appl. No. 14/312,427, 7 pages.
Non-Final Office Action of Aug. 21, 2015 for U.S. Appl. No. 14/312,427, 28 pages.
Non-Final Office Action of Jun. 3, 2015 for U.S. Appl. No. 14/534,636, 24 pages.
Notice of Allowance of Sep. 15, 2015 for U.S. Appl. No. 14/534,636, 11 pages.
Restriction Requirement of Oct. 29, 2015 for U.S. Appl. No. 14/559,149, 6 pages.
Restriction Requirement of Nov. 25, 2015 for U.S. Appl. No. 14/600,506, 6 pages.
Final Office Action of Dec. 16, 2015 for U.S. Appl. No. 14/312,427, 18 pages.
Notice of Allowance of Feb. 17, 2016 for U.S. Appl. No. 14/559,149, 35 pages.
Notice of Allowance of Feb. 12, 2016 for U.S. Appl. No. 14/176,403, 14 pages.
Notice of Allowance of Mar. 4, 2016 for U.S. Appl. No. 14/312,427, 15 pages.
Non-Final Office Action of Mar. 8, 2016 for U.S. Appl. No. 14/600,506, 36 pages.

(56) References Cited

OTHER PUBLICATIONS

U.S. Appl. No. 14/480,398, Restriction Requirement mailed Oct. 22, 2015, 5 pages.
U.S. Appl. No. 14/480,398, Non-Final Office Action mailed Mar. 17, 2016, 16 pages.
U.S. Appl. No. 14/580,693, Non-Final Office Action mailed Jun. 16, 2016, 22 pages.
U.S. Appl. No. 14/600,506, Notice of Allowance mailed Aug. 9, 2016, 14 pages.
U.S. Appl. No. 14/480,398, Notice of Allowance mailed Aug. 12, 2016, 14 pages.
U.S. Appl. No. 14/968,710, Notice of Allowance mailed on Mar. 3, 2017, 17 pages.
U.S. Appl. No. 14/580,693, Notice of Allowance mailed on Jan. 17, 2017, 11 pages.
U.S. Appl. No. 12/778,718, Notice of Allowance mailed on Jun. 13, 2012, 7 pages.
U.S. Appl. No. 14/175,622, Non-Final Office Action mailed on Apr. 27, 2015, 13 pages.
U.S. Appl. No. 14/175,622, Notice of Allowance mailed on Aug. 10, 2015, 9 pages.
U.S. Appl. No. 14/176,403, Corrected Notice of Allowability mailed on Mar. 28, 2016, 2 pages.
U.S. Appl. No. 14/312,427, Corrected Notice of Allowability mailed on Mar. 31, 2016, 2 pages.
U.S. Appl. No. 14/559,149, Corrected Notice of Allowability mailed on Mar. 21, 2016, 2 pages.
U.S. Appl. No. 14/580,693, filed Dec. 23, 2014.
U.S. Appl. No. 14580,693, Notice of Allowance mailed on Jan. 17, 2017, 11 pages.
U.S. Appl. No. 14/931,743, Notice of Allowance mailed on Mar. 31, 2016, 10 pages.
U.S. Appl. No. 15/173,441, filed Jun. 3, 2016.
U.S. Appl. No. 15/176,076, Restriction Requirement mailed on Dec. 30, 2016, 4 pages.
U.S. Appl. No. 15/176,076, filed Jun. 7, 2016.
U.S. Appl. No. 15/177,710, Non-Final Office Action mailed on Dec. 30, 2016.
U.S. Appl. No. 15/177,710, First Action Interview Pilot Program Pre-Interview Communication mailed on Jan. 12, 2017, 29 pages.
U.S. Appl. No. 15/177,710, filed Jun. 9, 2016.
U.S. Appl. No. 15/180,737, filed Jun. 13, 2016.
U.S. Appl. No. 15/209,309, Notice of Allowance mailed on Dec. 19, 2016, 12 pages.
U.S. Appl. No. 15/209,309, filed Jul. 13, 2016.
U.S. Appl. No. 15/209,309, Notice of Allowance mailed on Dec. 19, 2016, 42 pages.
U.S. Appl. No. 15/356,302, Non-Final Office Action dated May 5, 2017, 8 pages.
U.S. Appl. No. 15/177,710, Notice of Allowance dated May 2, 2017, 10 pages.
U.S. Appl. No. 15/176,076, Non-Final Office Action dated Jun. 6, 2017, 14 pages.
U.S. Appl. No. 15/480,239, Non-Final Office Action dated Jul. 3, 2017, 13 pages.

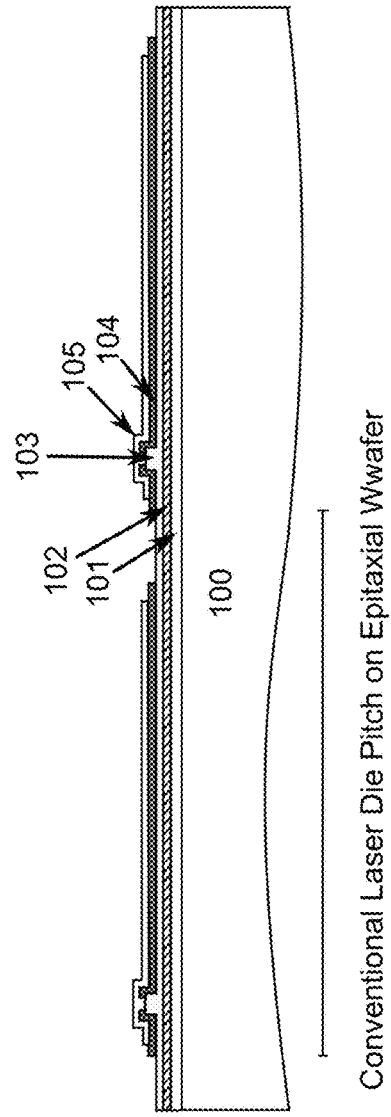

Figure 2: Die Expanded Laser Diode
Epitaxial Wafer Before Die Expansion
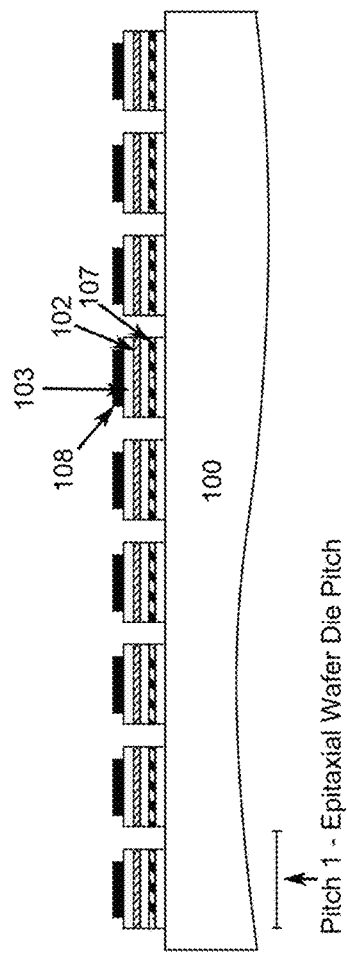
Die Expanded Laser Diode:
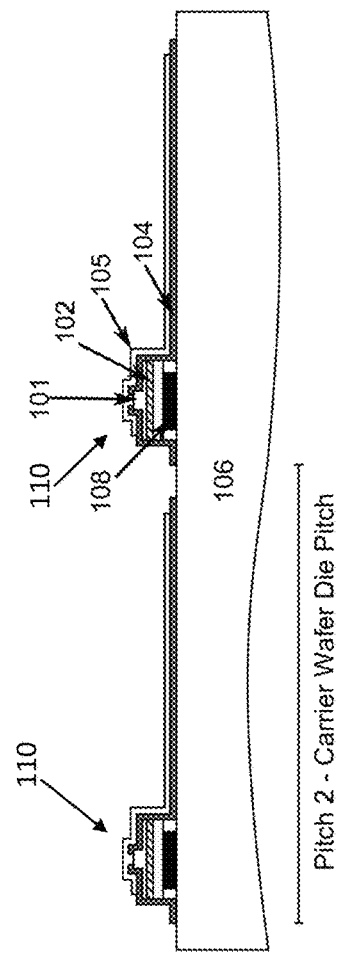

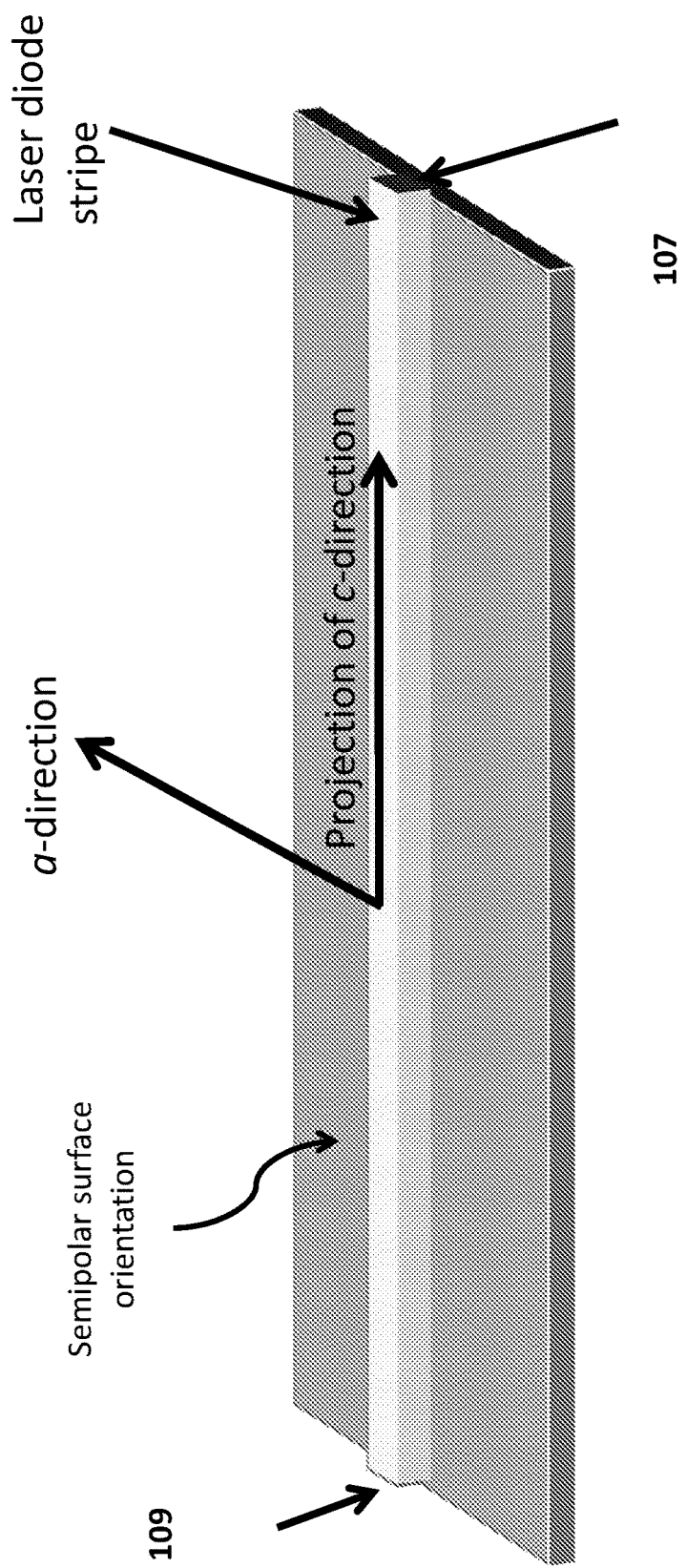
Figure 3: Schematic diagram of semipolar laser diode with the cavity aligned in the projection of c-direction with cleaved or etched mirrors

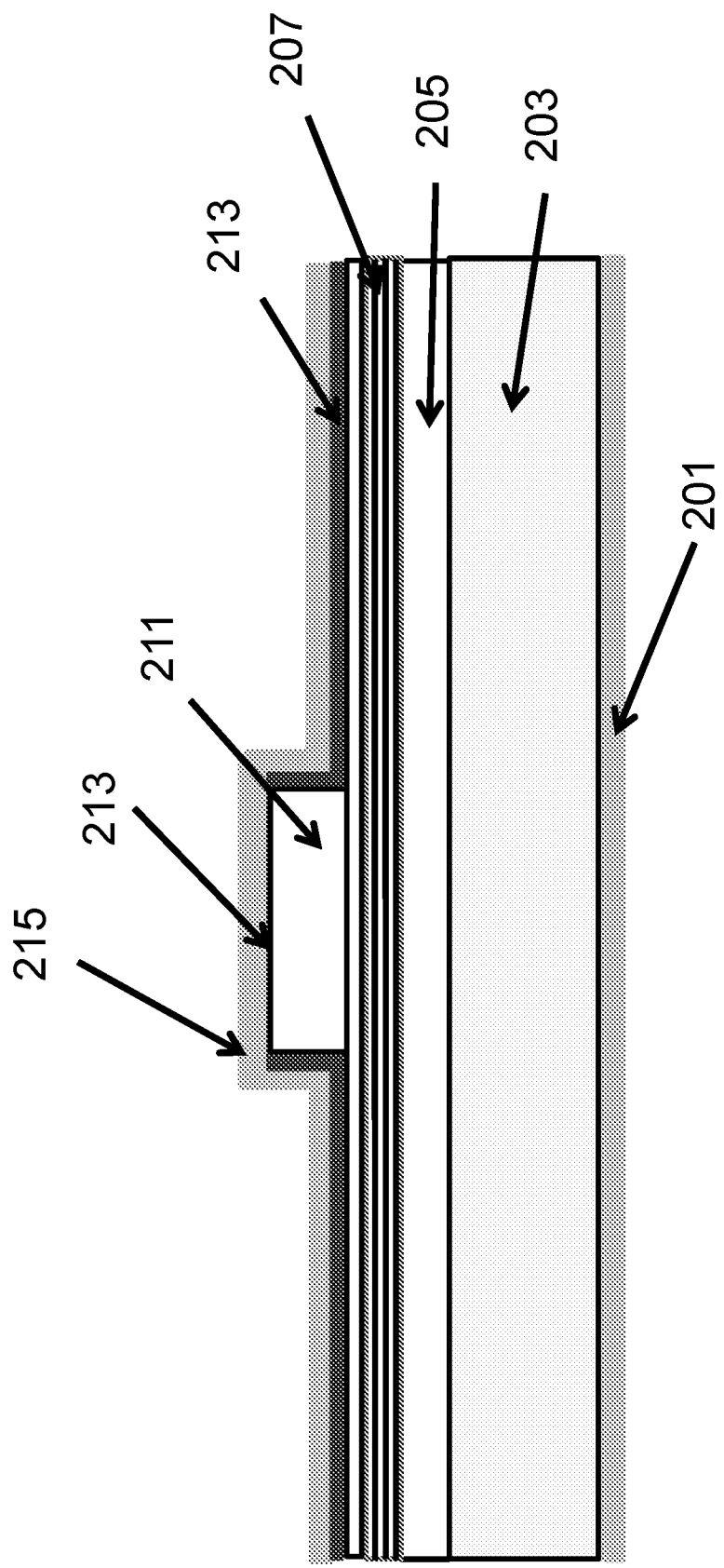
Figure 4: Schematic cross-section of ridge laser diode

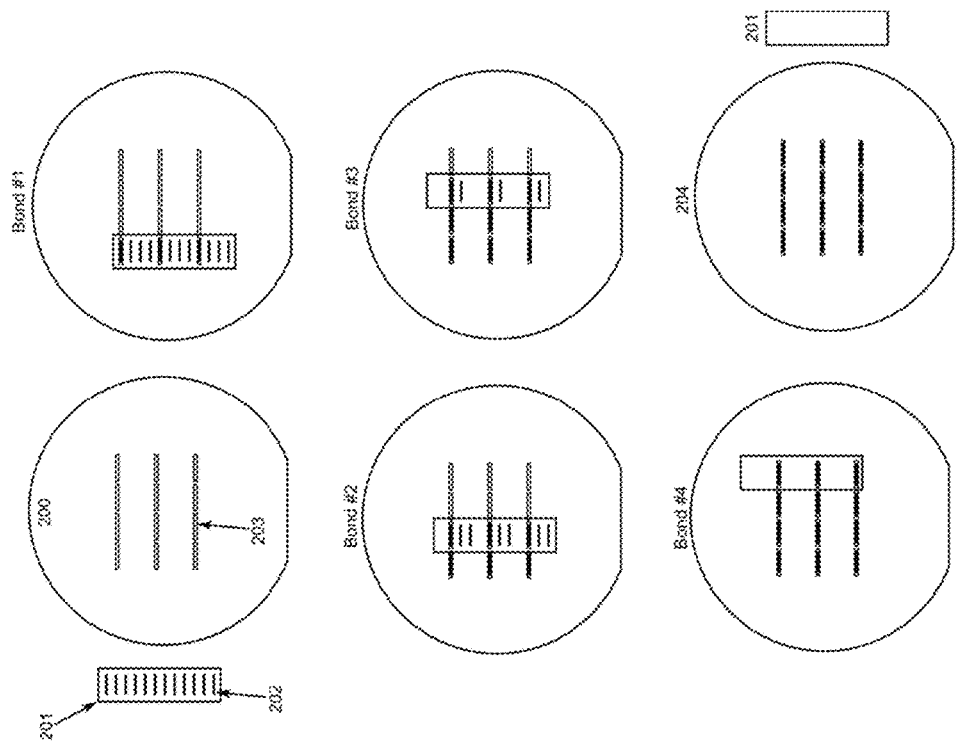
Figure 5: Selective Area Bonding – Top View

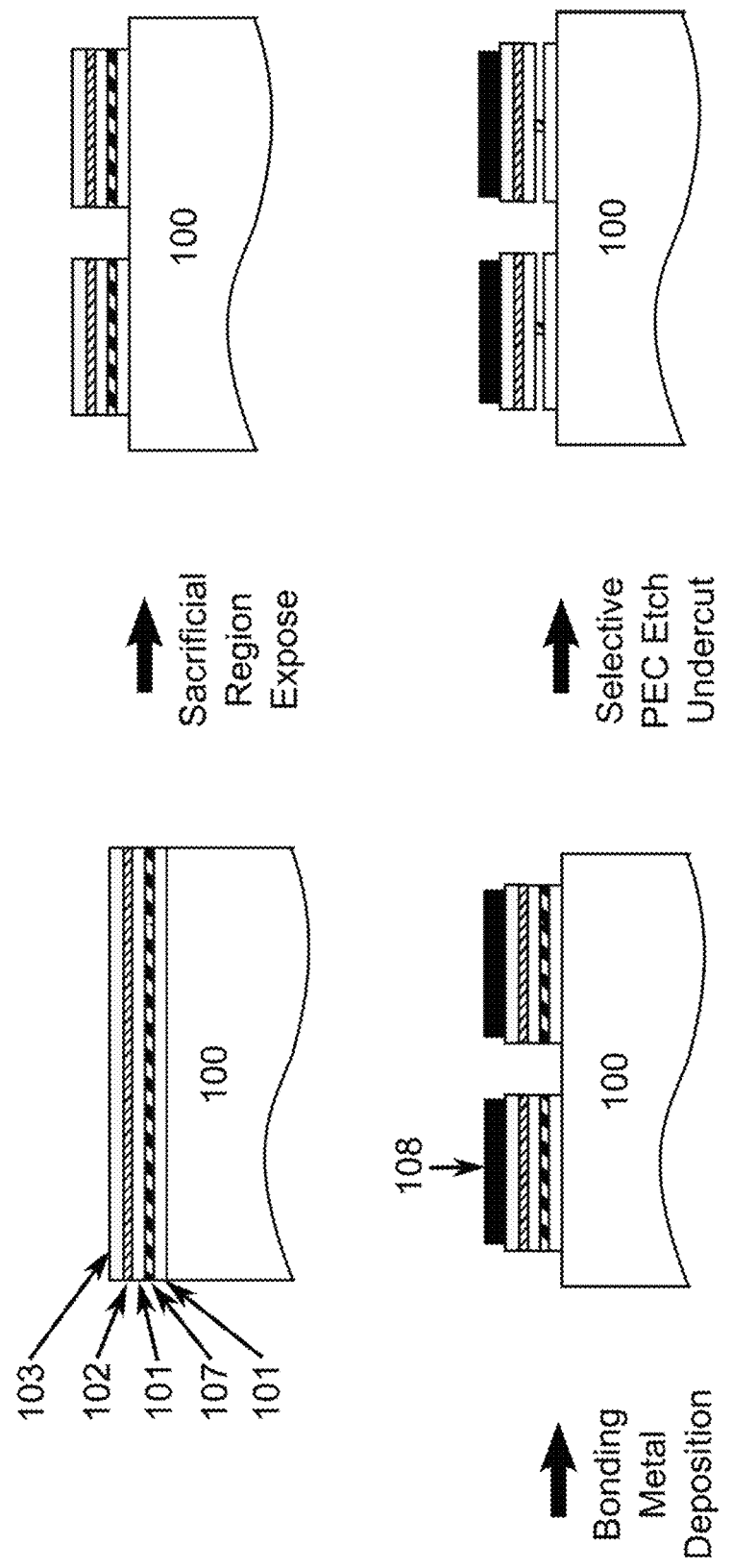

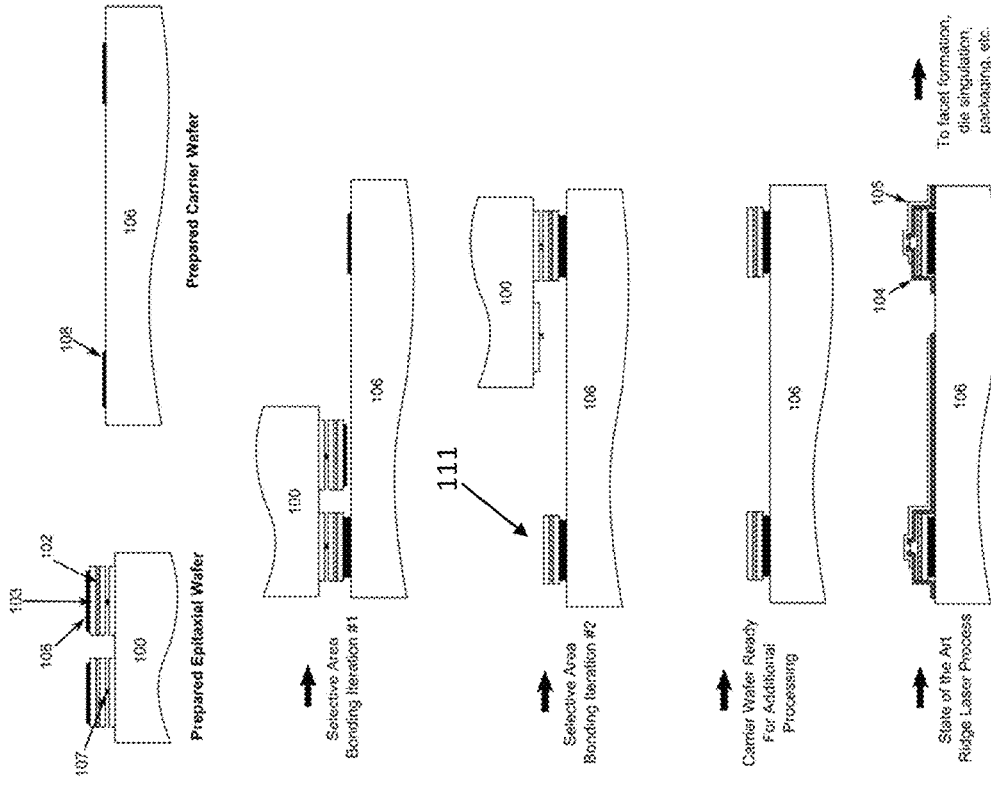
Figure 7: Selective Area Bonding – Side View

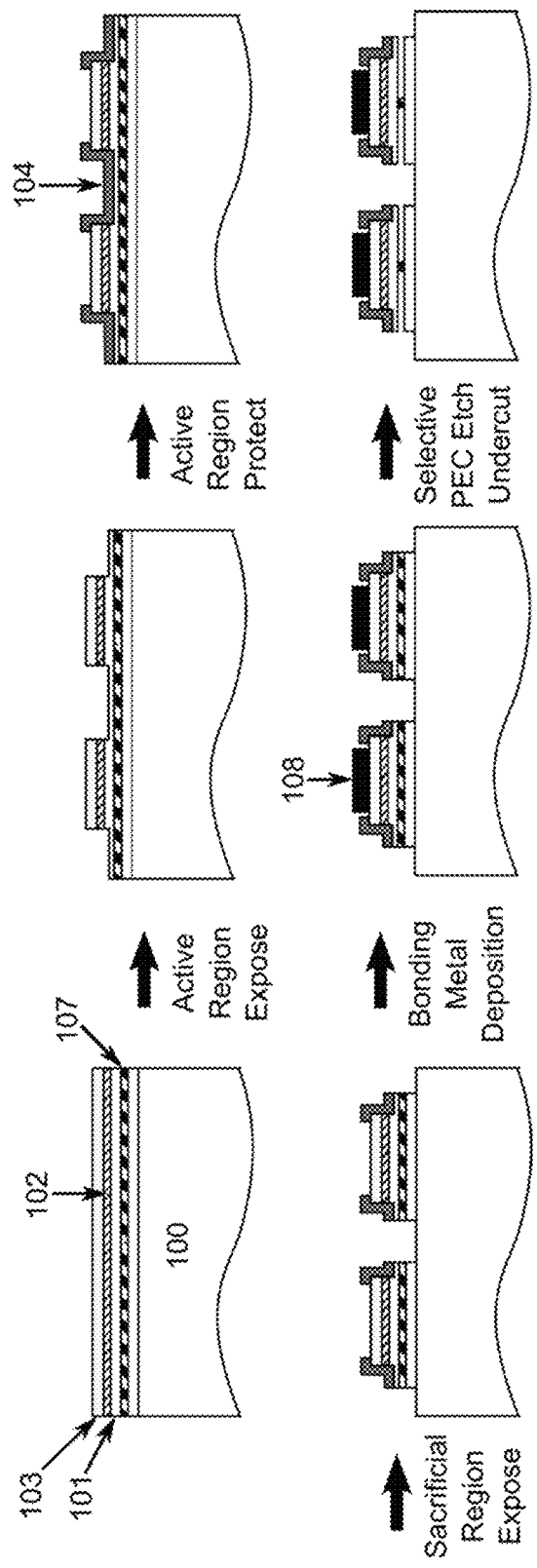
Figure 8: Epitaxy Prep Process Flow: with Active Region Protect

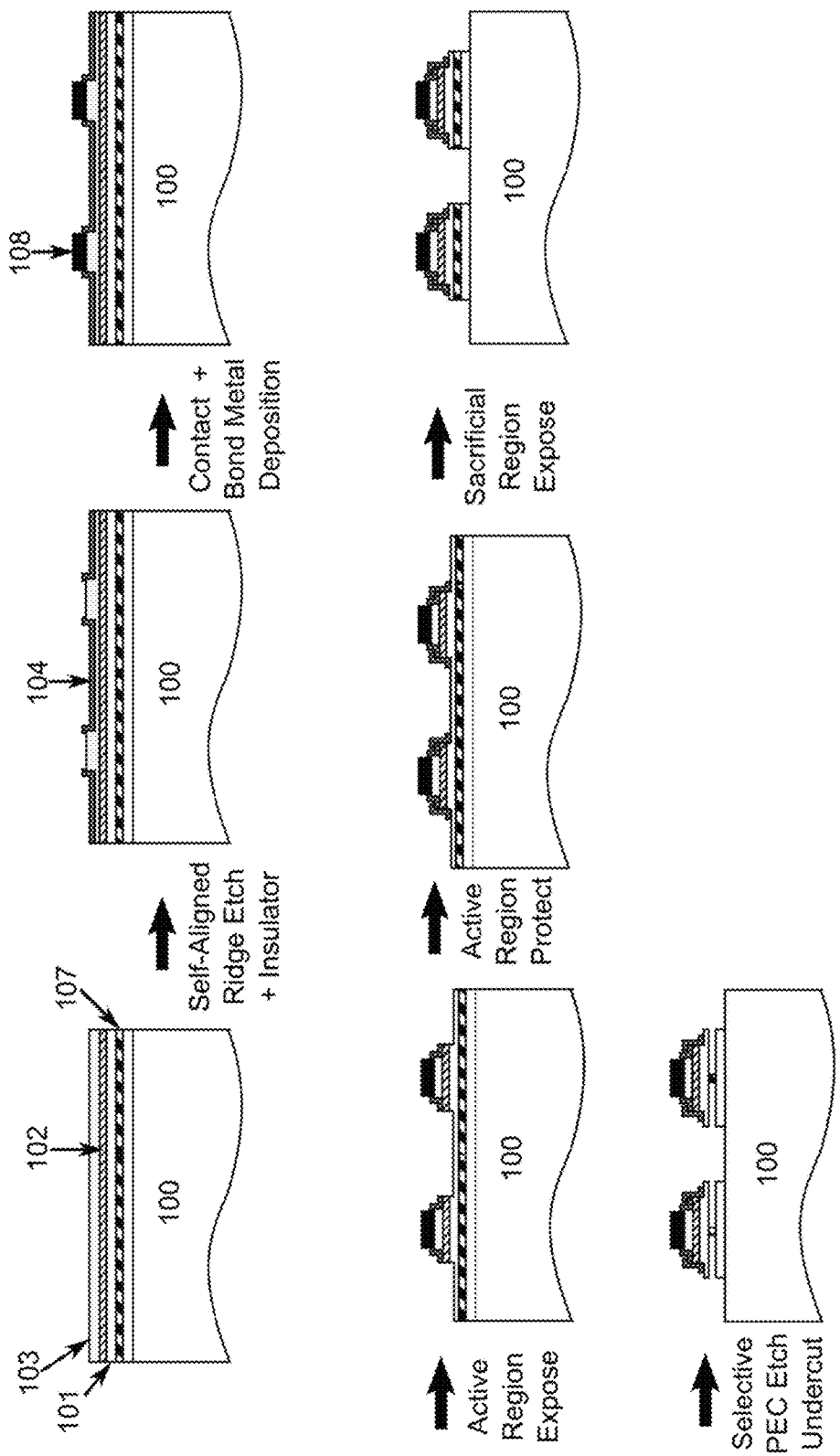
Figure 9: Epitaxy Prep Process Flow: With Active Region Protect + Ridge Before Bonding

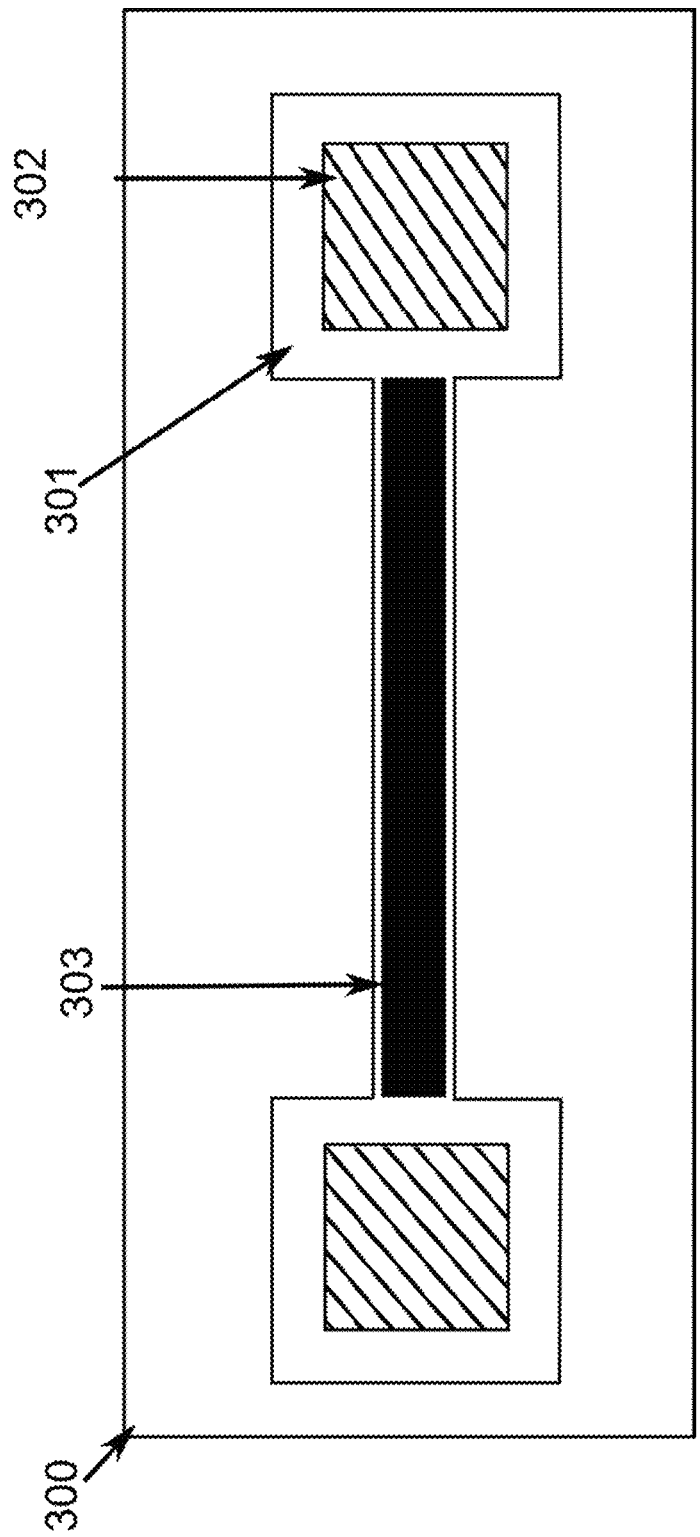
Figure 10: Anchored PEC Undercut Top View

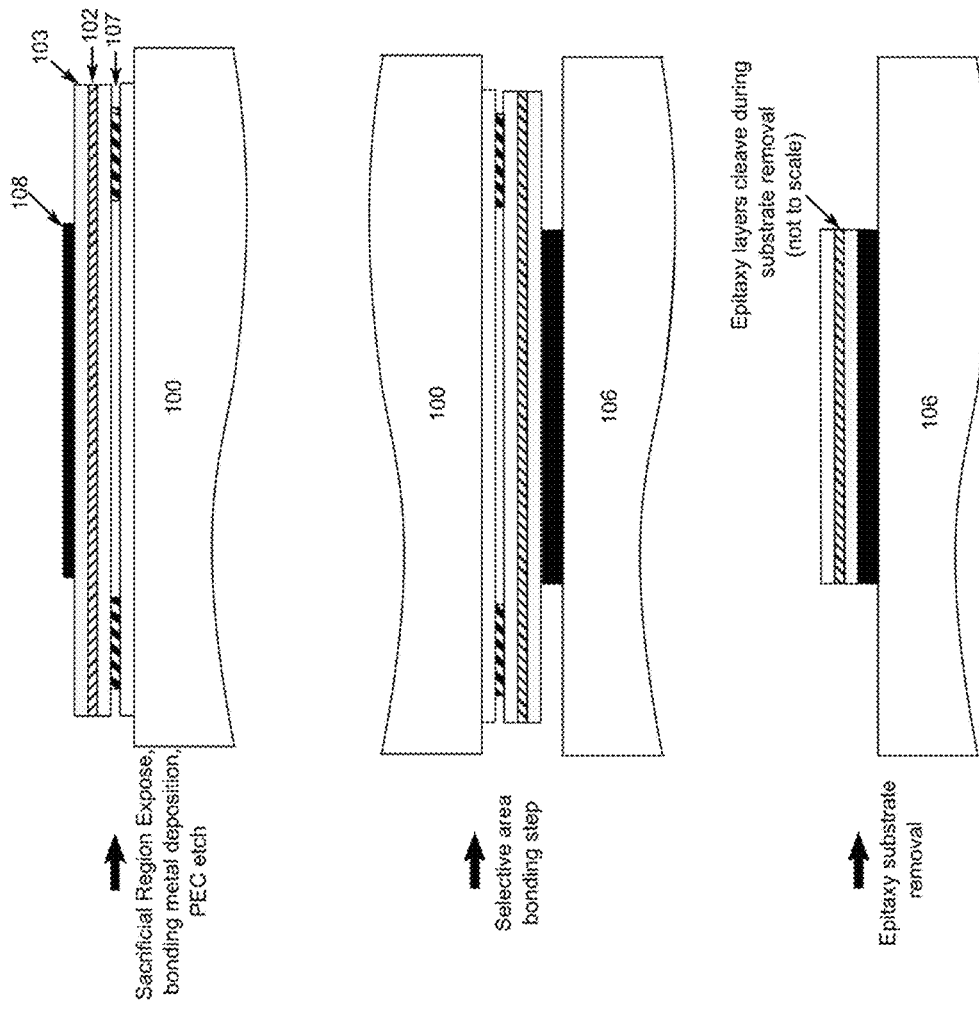
Figure 11: Anchored PEC Undercut Side View

METHOD FOR MANUFACTURING GALLIUM AND NITROGEN BEARING LASER DEVICES WITH IMPROVED USAGE OF SUBSTRATE MATERIAL

CROSS-REFERENCE TO RELATED APPLICATIONS

This application is a continuation of U.S. application Ser. No. 14/176,403, filed Feb. 10, 2014, the entire contents of which are incorporated herein by reference in their entirety for all purposes.

BACKGROUND

In 1960, the laser was first demonstrated by Theodore H. Maiman at Hughes Research Laboratories in Malibu. This laser utilized a solid-state flash lamp-pumped synthetic ruby crystal to produce red laser light at 694 nm. By 1964, blue and green laser output was demonstrated by William Bridges at Hughes Aircraft utilizing a gas laser design called an Argon ion laser. The Ar-ion laser utilized a noble gas as the active medium and produced laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the wall plug efficiency was <0.1%, and the size, weight, and cost of the lasers were undesirable as well.

As laser technology evolved, more efficient lamp pumped solid state laser designs were developed for the red and infrared wavelengths, but these technologies remained a challenge for blue and green and blue lasers. As a result, lamp pumped solid state lasers were developed in the infrared, and the output wavelength was converted to the visible using specialty crystals with nonlinear optical properties. A green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) had wall plug efficiency of ~1%, and were more efficient than Ar-ion gas lasers, but were still too inefficient, large, expensive, fragile for broad deployment outside of specialty scientific and medical applications. Additionally, the gain crystal used in the solid state lasers typically had energy storage properties which made the lasers difficult to modulate at high speeds which limited its broader deployment.

To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal, which lases at 1064 nm, 1064 nm goes into frequency conversion crystal which converts to visible 532 nm. The DPSS laser technology extended the life and improved the wall plug efficiency of the LPSS lasers to 5-10%, and further commercialization ensued into more high-end specialty industrial, medical, and scientific applications. However, the change to diode pumping increased the system cost and required precise temperature controls, leaving the laser with substantial size, power consumption while not addressing the energy storage properties which made the lasers difficult to modulate at high speeds.

As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal which converts to visible 532 nm green light. These lasers designs are meant to improve the efficiency, cost and size compared to DPSS-SHG lasers, but the specialty diodes and crystals required make this challenging today. Additionally, while the diode-SHG lasers have the benefit of being directly modulate-able, they suffer from severe sensitivity to temperature which limits their application. Currently the only viable direct blue and green laser diode structures are fabricated from the wurtzite AlGaInN material system. The manufacturing of light emitting diodes from GaN related materials is dominated by the heteroepitaxial growth of GaN on foreign substrates such as Si, SiC and sapphire. Laser diode devices operate at such high current densities that the crystalline defects associated with heteroepitaxial growth are not acceptable in laser diode devices due to the high operational current densities found in laser diodes. Because of this, very low defect-density, free-standing GaN substrates have become the substrate of choice for GaN laser diode manufacturing. Unfortunately, such substrates are costly and inefficient.

SUMMARY

The invention provides a method for fabricating semiconductor laser diodes. Typically these devices are fabricated using an epitaxial deposition, followed by processing steps on the epitaxial substrate and overlying epitaxial material. What follows is a general description of the typical configuration and fabrication of these devices.

In an example, the present invention provides a method for manufacturing a gallium and nitrogen containing laser diode device. The method includes providing a gallium and nitrogen containing substrate having a surface region and forming epitaxial material overlying the surface region, the epitaxial material comprising an n-type cladding region, an active region comprising of at least one active layer overlying the n-type cladding region, and a p-type cladding region overlying the active layer region. The method includes patterning the epitaxial material to form a plurality of dice, each of the dice corresponding to at least one laser device, characterized by a first pitch between a pair of dice, the first pitch being less than a design width. As used herein, the design with corresponds to an actual width or design parameter of a resulting laser diode device including active regions, contacts, and interconnects in an example, although there can be variations. The method includes transferring each of the plurality of dice to a carrier wafer such that each pair of dice is configured with a second pitch between each pair of dice, the second pitch being larger than the first pitch corresponding to the design width.

In an example, the design width can be the actual pitch of the resulting laser diode device with interconnects and contacts or another parameter related to the resulting laser diode device, which is larger than the pitch of the first pitch. As used herein the term "first" and "second" should not imply any order and should be broadly construed. Of course, there can be variations.

The present invention achieves these benefits and others in the context of known process technology. However, a further understanding of the nature and advantages of the present invention may be realized by reference to the latter portions of the specification and attached drawings.

BRIEF DESCRIPTION OF THE DRAWINGS

FIG. 1 is a simplified illustration of a laser diode according to an example of the present invention.

FIG. 2 is a simplified illustration of a die expanded laser diode according to an example of the present invention.

FIG. 3 is a schematic diagram of semipolar laser diode with the cavity aligned in the projection of c-direction with cleaved or etched mirrors in an example.

FIG. 4 is a schematic cross-section of ridge laser diode in an example.

FIG. 5 is a top view of a selective area bonding process in an example.

FIG. 6 is a simplified process flow for epitaxial preparation in an example.

FIG. 7 is a simplified side view illustration of selective area bonding in an example.

FIG. 8 is a simplified process flow of epitaxial preparation with active region protection in an example.

FIG. 9 is a simplified process flow of epitaxial preparation with active region protection and with ridge formation before bonding in an example.

FIG. 10 is a simplified illustration of anchored PEC undercut (top-view) in an example.

FIG. 11 is a simplified illustration of anchored PEC undercut (side-view) in an example.

DETAILED DESCRIPTION

The invention provides a method for fabricating semiconductor laser diodes. Typically these devices are fabricated using an epitaxial deposition, followed by processing steps on the epitaxial substrate and overlying epitaxial material. What follows is a general description of the typical configuration and fabrication of these devices.

Reference can be made to the following description of the drawings, as provided below.

Referring to FIG. 1 is a side view illustration of a state of the art GaN based laser diode after processing. Laser diodes are fabricated on the original gallium and nitrogen containing epitaxial substrate 100, typically with epitaxial n-GaN and n-side cladding layers 101, active region 102, p-GaN and p-side cladding 103, insulating layers 104 and contact/pad layers 105. Laser die pitch is labeled. All epitaxy material not directly under the laser ridge is wasted in this device design. In an example, n-type cladding which may be comprised of GaN, AlGaN, or InAlGaN.

Referring now to FIG. 2 is a side view illustrations of gallium and nitrogen containing epitaxial wafer 100 before the die expansion process and carrier wafer 106 after the die expansion process. This figure demonstrates a roughly five times expansion and thus five times improvement in the number of laser diodes, which can be fabricated from a single gallium and nitrogen containing substrate and overlying epitaxial material. In this example, laser ridges (or laser diode cavities) 110 are formed after transfer of the die to the carrier wafer 106. Typical epitaxial and processing layers are included for example purposes and are n-GaN and n-side cladding layers 101, active region 102, p-GaN and p-side cladding 103, insulating layers 104, and contact/pad layers 105. Additionally, a sacrificial region 107 and bonding material 108 are used during the die expansion process.

FIG. 3 is a schematic diagram of semipolar laser diode with the cavity aligned in the projection of c-direction with cleaved or etched mirrors. This figure provides an example of a ridge type laser diode fabricated on a semipolar substrate and shows a cavity architecture and mirrors. FIG. 3 shows a simplified schematic diagram of semipolar laser diode with the cavity aligned in the projection of c-direction with cleaved or etched mirrors. The laser stripe region is characterized by a cavity orientation substantially in a projection of a c-direction, which is substantially normal to an a-direction. The laser strip region has a first end 107 and a second end 109 and is formed on a projection of a c-direction on a {20-21} gallium and nitrogen containing substrate having a pair of cleaved or etched mirror structures (or laser diode mirrors), which face each other.

FIG. 4 is a Schematic cross-section of ridge laser diode in an example, and shows a simplified schematic cross-sectional diagram illustrating a state of the art laser diode structure. This figure provides an example of a cross-section of a ridge type laser diode and shows various features associated with the device. This diagram is merely an example, which should not unduly limit the scope of the claims herein. As shown, the laser device includes gallium nitride substrate 203, which has an underlying n-type metal back contact region 201. In an embodiment, the metal back contact region is made of a suitable material such as those noted below and others. In an embodiment, the device also has an overlying n-type gallium nitride layer 205, an active region 207, and an overlying p-type gallium nitride layer structured as a laser stripe region 211. Additionally, the device also includes an n-side separate confinement hetereostructure (SCH), p-side guiding layer or SCH, p-AlGaN EBL, among other features. In an embodiment, the device also has a p++type gallium nitride material 213 to form a contact region.

FIG. 5 is a simplified view of a top view of a selective area bonding process and illustrates a die expansion process via selective area bonding. The original gallium and nitrogen containing epitaxial wafer 201 has had individual die of epitaxial material and release layers defined through processing. Individual epitaxial material die are labeled 202 and are spaced at pitch 1. A round carrier wafer 200 has been prepared with patterned bonding pads 203. These bonding pads are spaced at pitch 2, which is an even multiple of pitch 1 such that selected sets of epitaxial die can be bonded in each iteration of the selective area bonding process. The selective area bonding process iterations continue until all epitaxial die have been transferred to the carrier wafer 204. The gallium and nitrogen containing epitaxy substrate 201 can now optionally be prepared for reuse.

In an example, FIG. 6 is a simplified diagram of process flow for epitaxial preparation including a side view illustration of an example epitaxy preparation process flow for the die expansion process. The gallium and nitrogen containing epitaxy substrate 100 and overlying epitaxial material are defined into individual die, bonding material 108 is deposited, and sacrificial regions 107 are undercut. Typical epitaxial layers are included for example purposes and are n-GaN and n-side cladding layers 101, active region 102, and p-GaN and p-side cladding 103.

In an example, FIG. 7 is a simplified illustration of a side view of a selective area bonding process in an example. Prepared gallium and nitrogen containing epitaxial wafer 100 and prepared carrier wafer 106 are the starting components of this process. The first selective area bonding iteration transfers a fraction of the epitaxial die, with additional iterations repeated as needed to transfer all epitaxial die. Once the die expansion process is completed, state of the art laser processing can continue on the carrier wafer. Typical epitaxial and processing layers are included for example purposes and are n-GaN and n-side cladding layers 101, active region 102, p-GaN and p-side cladding 103, insulating layers 104 and contact/pad layers 105. Additionally, a sacrificial region 107 and bonding material 108 are used during the die expansion process.

In an example, FIG. 8 is a simplified diagram of an epitaxy preparation process with active region protection. As shown is a side view illustration of an alternative epitaxial wafer preparation process flow during which sidewall passivation is used to protect the active region during any PEC undercut etch steps. This process flow allows for a wider selection of sacrificial region materials and compositions. Typical substrate, epitaxial, and processing layers are included for example purposes and are the gallium and nitrogen containing substrate 100, n-GaN and n-side cladding layers 101, active region 102, p-GaN and p-side cladding 103, insulating layers 104 and contact/pad layers 105. Additionally, a sacrificial region 107 and bonding material 108 are used during the die expansion process.

In an example, FIG. 9 is a simplified diagram of epitaxy preparation process flow with active region protection and ridge formation before bonding. As shown is a side view illustration of an alternative epitaxial wafer preparation process flow during which sidewall passivation is used to protect the active region during any PEC undercut etch steps and laser ridges are defined on the denser epitaxial wafer before transfer. This process flow potentially allows cost saving by performing additional processing steps on the denser epitaxial wafer. Typical substrate, epitaxial, and processing layers are included for example purposes and are the gallium and nitrogen containing substrate 100, n-GaN and n-side cladding layers 101, active region 102, p-GaN and p-side cladding 103, insulating layers 104 and contact/pad layers 105. Additionally, a sacrificial region 107 and bonding material 108 are used during the die expansion process.

FIG. 10 is a simplified example of anchored PEC undercut (top-view). As shown is a top view of an alternative release process during the selective area bonding. In this embodiment a top down etch is used to etch away the area 300, followed by the deposition of bonding metal 303. A PEC etch is then used to undercut the region 301. The sacrificial region 302 remains intact and serves as a mechanical support during the selective area bonding process.

FIG. 11 is a simplified view of anchored PEC undercut (side-view) in an example. As shown is a side view illustration of the anchored PEC undercut. Posts of sacrificial region are included at each end of the epitaxial die for mechanical support until the bonding process is completed. After bonding the epitaxial material will cleave at the unsupported thin film region between the bond pads and intact sacrificial regions, enabling the selective are bonding process. Typical epitaxial and processing layers are included for example purposes and are n-GaN and n-side cladding layers 101, active region 102, p-GaN and p-side cladding 103, insulating layers 104 and contact/pad layers 105. Additionally, a sacrificial region 107 and bonding material 108 are used during the die expansion process. Epitaxial material is transferred from the gallium and nitrogen containing epitaxial wafer 100 to the carrier wafer 106. Further details of the present method and structures can be found more particularly below.

As further background for the reader, gallium nitride, and related crystals, are difficult to produce in bulk form. Growth technologies capable of producing large area boules of GaN are still in their infancy, and costs for all orientations are significantly more expensive than similar wafer sizes of other semiconductor substrates such as Si, GaAs, and InP. While large area, free-standing GaN substrates (e.g. with diameters of two inches or greater) are available commercially, the availability of large area non-polar and semi-polar GaN susbtrates is quite restricted. Typically, these orientations are produced by the growth of a c-plane oriented bool, which is then sliced into rectangular wafers at some steep angle relative to the c-plane. The width of these wafers is limited by the thickness of the c-plane oriented boule, which in turn is restricted by the method of boule production (e.g. typically hydride vapor phase epitaxy (HVPE) on a foreign substrate). Such small wafer sizes are limiting in several respects. The first is that epitaxial growth must be carried out on such a small wafer, which increases the area fraction of the wafer that is unusable due to non-uniformity in growth near the wafer edge. The second is that after epitaxial growth of optoelectronic device layers on a substrate, the same number of processing steps are required on the small wafers to fabricate the final device as one would use on a large area wafer. Both of these effects drive up the cost of manufacturing devices on such small wafers, as both the cost per device fabricated and the fraction of wafer area that is unusable increases with decreasing wafer size. The relative immaturity of bulk GaN growth techniques additionally limits the total number of substrates which can be produced, potentially limiting the feasibility scaling up a non-polar or semi-polar GaN substrate based device.

Given the high cost of all orientations of GaN substrates, the difficulty in scaling up wafer size, the inefficiencies inherent in the processing of small wafers, and potential supply limitations on semi-polar and nonpolar wafers, it becomes extremely desirable to maximize utilization of substrates and epitaxial material. In the fabrication of lateral cavity laser diodes, it is typically the case that minimum die length is determined by the laser cavity length, but the minimum die width is determined by other device components such as wire bonding pads or considerations such as mechanical area for die handling in die attach processes. That is, while the laser cavity length limits the laser die length, the laser die width is typically much larger than the laser cavity width. Since the GaN substrate and epitaxial material are only critical in and near the laser cavity region this presents a great opportunity to invent novel methods to form only the laser cavity region out of these relatively expensive materials and form the bond pad and mechanical structure of the chip from a lower cost material. Typical dimensions for laser cavity widths are 1-30 µm, while wire bonding pads are ~100 µm wide. This means that if the wire bonding pad width restriction and mechanical handling considerations were eliminated from the GaN chip dimension between >3 and 100 times more laser diode die could be fabricated from a single epitaxial gallium and nitrogen containing wafer. This translates to a >3 to 100 times reduction in epitaxy and substrate costs. In conventional device designs, the relatively large bonding pads are mechanically supported by the epitaxy wafer, although they make no use of the material properties of the semiconductor beyond structural support.

In an example, the present invention is a method of maximizing the number of GaN laser devices which can be fabricated from a given epitaxial area on a gallium and nitrogen containing substrate by spreading out the epitaxial material on a carrier wafer such that the wire bonding pads or other structural elements are mechanically supported by relatively inexpensive carrier wafer, while the light emitting regions remain fabricated from the necessary epitaxial material. This invention will drastically reduce the chip cost in all gallium and nitrogen based laser diodes, and in particular could enable cost efficient nonpolar and semipolar laser diode technology.

These devices include a gallium and nitrogen containing substrate (e.g., GaN) comprising a surface region oriented in either a semipolar or non-polar configuration, but can be others. The device also has a gallium and nitrogen containing material comprising InGaN overlying the surface region. In a specific embodiment, the present laser device can be employed in either a semipolar or non-polar gallium containing substrate, as described below. As used herein, the term "substrate" can mean the bulk substrate or can include overlying growth structures such as a gallium and nitrogen containing epitaxial region, or functional regions such as n-type GaN, combinations, and the like. We have also explored epitaxial growth and cleave properties on semipolar crystal planes oriented between the nonpolar m-plane and the polar c-plane. In particular, we have grown on the {30-31} and {20-21} families of crystal planes. We have achieved promising epitaxy structures and cleaves that will create a path to efficient laser diodes operating at wavelengths from about 400 nm to green, e.g., 500 nm to 540 nm. These results include bright blue epitaxy in the 450 nm range, bright green epitaxy in the 520 nm range, and smooth cleave planes orthogonal to the projection of the c-direction.

In a specific embodiment, the gallium nitride substrate member is a bulk GaN substrate characterized by having a semipolar or non-polar crystalline surface region, but can be others. In a specific embodiment, the bulk nitride GaN substrate comprises nitrogen and has a surface dislocation density between about $10E5$ cm$^{-2}$ and about $10E7$ cm$^{-2}$ or below $10E5$ cm$^{-2}$. The nitride crystal or wafer may comprise $Al_xIn_yGa_{1-x-y}N$, where $0 \leq x$, y, $x+y \leq 1$. In one specific embodiment, the nitride crystal comprises GaN. In one or more embodiments, the GaN substrate has threading dislocations, at a concentration between about $10E5$ cm$^{-2}$ and about $10E8$ cm$^{-2}$, in a direction that is substantially orthogonal or oblique with respect to the surface. As a consequence of the orthogonal or oblique orientation of the dislocations, the surface dislocation density is between about $10E5$ cm$^{-2}$ and about $10E7$ cm$^{-2}$ or below about $10E5$ cm$^{-2}$. In a specific embodiment, the device can be fabricated on a slightly off-cut semipolar substrate as described in U.S. Ser. No. 12/749,466 filed Mar. 29, 2010, which claims priority to U.S. Provisional No. 61/164,409 filed Mar. 28, 2009, commonly assigned, and hereby incorporated by reference herein.

The substrate typically is provided with one or more of the following epitaxially grown elements, but is not limiting:
- an n-GaN cladding region with a thickness of 50 nm to about 6000 nm with a Si or oxygen doping level of about $5E16$ cm$^{-3}$ to $1E19$ cm$^{-3}$
- an InGaN region of a high indium content and/or thick InGaN layer(s) or Super SCH region;
- a higher bandgap strain control region overlying the InGaN region;
- optionally, an SCH region overlying the InGaN region;
- multiple quantum well active region layers comprised of three to five or four to six 3.0-5.5.0 nm InGaN quantum wells separated by 1.5-10.0 nm GaN barriers
- optionally, a p-side SCH layer comprised of InGaN with molar a fraction of indium of between 1% and 10% and a thickness from 15 nm to 100 nm
- an electron blocking layer comprised of AlGaN with molar fraction of aluminum of between 5% and 20% and thickness from 10 nm to 15 nm and doped with Mg.
- a p-GaN cladding layer with a thickness from 400 nm to 1000 nm with Mg doping level of $5E17$ cm$^{-3}$ to $1E19$ cm$^{-3}$
- a p++-GaN contact layer with a thickness from 20 nm to 40 nm with Mg doping level of $1E20$ cm$^{-3}$ to $1E21$ cm$^{-3}$ Typically each of these regions is formed using at least an epitaxial deposition technique of metal organic chemical vapor deposition (MOCVD), molecular beam epitaxy (MBE), or other epitaxial growth techniques suitable for GaN growth. The active region can include one to twenty quantum well regions according to one or more embodiments. As an example following deposition of the n-type $Al_uIn_vGa_{1-u-v}N$ layer for a predetermined period of time, so as to achieve a predetermined thickness, an active layer is deposited. The active layer may comprise a single quantum well or a multiple quantum well, with 2-10 quantum wells. The quantum wells may comprise InGaN wells and GaN barrier layers. In other embodiments, the well layers and barrier layers comprise $Al_wIn_xGa_{1-w-x}N$ and $Al_yIn_zGa_{1-y-z}N$, respectively, where $0 \leq w$, x, y, z, w+x, y+z<1, where w<u, y and/or x>v, z so that the bandgap of the well layer(s) is less than that of the barrier layer(s) and the n-type layer. The well layers and barrier layers may each have a thickness between about 1 nm and about 15 nm. In another embodiment, the active layer comprises a double heterostructure, with an InGaN or AlwInxGa1-w-xN layer about 10 nm to 100 nm thick surrounded by GaN or $Al_yIn_zGa_{1-y-z}N$ layers, where w<u, y and/or x>v, z. The composition and structure of the active layer are chosen to provide light emission at a preselected wavelength. The active layer may be left undoped (or unintentionally doped) or may be doped n-type or p-type.

The active region can also include an electron blocking region, and a separate confinement heterostructure. In some embodiments, an electron blocking layer is preferably deposited. The electron-blocking layer may comprise $Al_sIn_tGa_{1-s-t}N$, where $0 \leq s$, t, s+t$\leq$1, with a higher bandgap than the active layer, and may be doped p-type or the electron blocking layer comprises an AlGaN/GaN superlattice structure, comprising alternating layers of AlGaN and GaN. Alternatively, there may be no electron blocking layer. As noted, the p-type gallium nitride structure, is deposited above the electron blocking layer and active layer(s). The p-type layer may be doped with Mg, to a level between about $10E16$ cm-3 and $10E22$ cm-3, and may have a thickness between about 5 nm and about 1000 nm. The outermost 1-50 nm of the p-type layer may be doped more heavily than the rest of the layer, so as to enable an improved electrical contact.

The present invention is directed towards the fabrication of optoelectronic devices from semiconductor wafers. In particular, the present invention increases utilization of substrate wafers and epitaxy material through a selective area bonding process to transfer individual die of epitaxy material to a carrier wafer in such a way that the die pitch is increased on the carrier wafer relative to the original epitaxy wafer. The arrangement of epitaxy material allows device components which do not require the presence of the expensive gallium and nitrogen containing substrate and overlying epitaxy material often fabricated on a gallium and nitrogen containing substrate to be fabricated on the lower cost carrier wafer, allowing for more efficient utilization of the gallium and nitrogen containing substrate and overlying epitaxy material.

In an embodiment, mesas of gallium and nitrogen containing laser diode epitaxy material are fabricated in a dense array on a gallium and nitrogen containing substrate. This pattern pitch will be referred to as the 'first pitch'. The first pitch is often a design width that is suitable for fabricating each of the epitaxial regions on the substrate, while not large enough for completed laser devices, which often desire larger non-active regions or regions for contacts and the like. For example, these mesas would have a first pitch ranging from about 5 microns to about 30 microns or to about 50 microns. Each of these mesas is a 'die'.

In an example, these die are then transferred to a carrier wafer at a second pitch such that the second pitch on the carrier wafer is greater than the first pitch on the gallium and nitrogen containing substrate. In an example, the second pitch is configured with the die to allow each die with a portion of the carrier wafer to be a laser device, including contacts and other components. For example, the second pitch would be about 100 microns to about 200 microns or to about 300 microns. The second die pitch allows for easy mechanical handling and room for wire bonding pads positioned in the regions of carrier wafer in-between epitaxy mesas, enabling a greater number of laser diodes to be fabricated from a given gallium and nitrogen containing substrate and overlying epitaxy material. Side view schematics of state of the art and die expanded laser diodes are shown in FIG. 1 and FIG. 2. Typical dimensions for laser ridge widths and the widths necessary for mechanical and wire bonding considerations are from 1 µm to 30 µm and from 100 µm to 300 µm, respectively, allowing for large potential improvements in gallium and nitrogen containing substrate and overlying epitaxy material usage efficiency with the current invention.

FIG. 4 is a simplified schematic cross-sectional diagram illustrating a state of the art laser diode structure. This diagram is merely an example, which should not unduly limit the scope of the claims herein. One of ordinary skill in the art would recognize other variations, modifications, and alternatives. As shown, the laser device includes gallium nitride substrate 203, which has an underlying n-type metal back contact region 201. In an embodiment, the metal back contact region is made of a suitable material such as those noted below and others. Further details of the contact region can be found throughout the present specification and more particularly below.

In an embodiment, the device also has an overlying n-type gallium nitride layer 205, an active region 207, and an overlying p-type gallium nitride layer structured as a laser stripe region 211. Additionally, the device also includes an n-side separate confinement hetereostructure (SCH) 206, p-side guiding layer or SCH 208, p-AlGaN EBL 209, among other features. In an embodiment, the device also has a p++ type gallium nitride material 213 to form a contact region. In an embodiment, the p++ type contact region has a suitable thickness and may range from about 10 nm 50 nm, or other thicknesses. In an embodiment, the doping level can be higher than the p-type cladding region and/or bulk region. In an embodiment, the p++ type region has doping concentration ranging from about $10^{19}$ to $10^{21}$ Mg/cm$^3$, and others. The p++ type region preferably causes tunneling between the semiconductor region and overlying metal contact region. In an embodiment, each of these regions is formed using at least an epitaxial deposition technique of metal organic chemical vapor deposition (MOCVD), molecular beam epitaxy (MBE), or other epitaxial growth techniques suitable for GaN growth. In an embodiment, the epitaxial layer is a high quality epitaxial layer overlying the n-type gallium nitride layer. In some embodiments the high quality layer is doped, for example, with Si or O to form n-type material, with a dopant concentration between about $10^{16}$ cm$^{-3}$ and $10^{20}$ cm$^{-3}$.

The device has a laser stripe region formed overlying a portion of the off-cut crystalline orientation surface region. As example, FIG. 3 is a simplified schematic diagram of semipolar laser diode with the cavity aligned in the projection of c-direction with cleaved or etched mirrors. The laser stripe region is characterized by a cavity orientation substantially in a projection of a c-direction, which is substantially normal to an a-direction. The laser strip region has a first end 107 and a second end 109 and is formed on a projection of a c-direction on a {20-21} gallium and nitrogen containing substrate having a pair of cleaved mirror structures, which face each other. The first cleaved facet comprises a reflective coating and the second cleaved facet comprises no coating, an antireflective coating, or exposes gallium and nitrogen containing material. The first cleaved facet is substantially parallel with the second cleaved facet. The first and second cleaved facets are provided by a scribing and breaking process according to an embodiment or alternatively by etching techniques using etching technologies such as reactive ion etching (ME), inductively coupled plasma etching (ICP), or chemical assisted ion beam etching (CAIBE), or other method. The first and second mirror surfaces each comprise a reflective coating. The coating is selected from silicon dioxide, hafnia, and titania, tantalum pentoxide, zirconia, including combinations, and the like. Depending upon the design, the mirror surfaces can also comprise an anti-reflective coating.

In a specific embodiment, the method of facet formation includes subjecting the substrates to a laser for pattern formation. In a preferred embodiment, the pattern is configured for the formation of a pair of facets for one or more ridge lasers. In a preferred embodiment, the pair of facets face each other and are in parallel alignment with each other. In a preferred embodiment, the method uses a UV (355 nm) laser to scribe the laser bars. In a specific embodiment, the laser is configured on a system, which allows for accurate scribe lines configured in one or more different patterns and profiles. In one or more embodiments, the laser scribing can be performed on the back-side, front-side, or both depending upon the application. Of course, there can be other variations, modifications, and alternatives.

In a specific embodiment, the method uses backside laser scribing or the like. With backside laser scribing, the method preferably forms a continuous line laser scribe that is perpendicular to the laser bars on the backside of the GaN substrate. In a specific embodiment, the laser scribe is generally 15-20 um deep or other suitable depth. Preferably, backside scribing can be advantageous. That is, the laser scribe process does not depend on the pitch of the laser bars or other like pattern. Accordingly, backside laser scribing can lead to a higher density of laser bars on each substrate according to a preferred embodiment. In a specific embodiment, backside laser scribing, however, may lead to residue from the tape on one or more of the facets. In a specific embodiment, backside laser scribe often requires that the substrates face down on the tape. With front-side laser scribing, the backside of the substrate is in contact with the tape. Of course, there can be other variations, modifications, and alternatives.

Laser scribe Pattern: The pitch of the laser mask is about 200 um, but can be others. The method uses a 170 um scribe with a 30 um dash for the 200 um pitch. In a preferred embodiment, the scribe length is maximized or increased while maintaining the heat affected zone of the laser away from the laser ridge, which is sensitive to heat.

Laser scribe Profile: A saw tooth profile generally produces minimal facet roughness. It is believed that the saw tooth profile shape creates a very high stress concentration in the material, which causes the cleave to propagate much easier and/or more efficiently.

In a specific embodiment, the method of facet formation includes subjecting the substrates to mechanical scribing for pattern formation. In a preferred embodiment, the pattern is configured for the formation of a pair of facets for one or more ridge lasers. In a preferred embodiment, the pair of facets face each other and are in parallel alignment with each other. In a preferred embodiment, the method uses a diamond tipped scribe to physically scribe the laser bars, though as would be obvious to anyone learned in the art a scribe tipped with any material harder than GaN would be adequate. In a specific embodiment, the laser is configured on a system, which allows for accurate scribe lines configured in one or more different patterns and profiles. In one or more embodiments, the mechanical scribing can be performed on the back-side, front-side, or both depending upon the application. Of course, there can be other variations, modifications, and alternatives.

In a specific embodiment, the method uses backside scribing or the like. With backside mechanical scribing, the method preferably forms a continuous line scribe that is perpendicular to the laser bars on the backside of the GaN substrate. In a specific embodiment, the laser scribe is generally 15-20 um deep or other suitable depth. Preferably, backside scribing can be advantageous. That is, the mechanical scribe process does not depend on the pitch of the laser bars or other like pattern. Accordingly, backside scribing can lead to a higher density of laser bars on each substrate according to a preferred embodiment. In a specific embodiment, backside mechanical scribing, however, may lead to residue from the tape on one or more of the facets. In a specific embodiment, backside mechanical scribe often requires that the substrates face down on the tape. With front-side mechanical scribing, the backside of the substrate is in contact with the tape. Of course, there can be other variations, modifications, and alternatives.

It is well known that etch techniques such as chemical assisted ion beam etching (CAIBE), inductively coupled plasma (ICP) etching, or reactive ion etching (RIE) can result in smooth and vertical etched sidewall regions, which could serve as facets in etched facet laser diodes. In the etched facet process a masking layer is deposited and patterned on the surface of the wafer. The etch mask layer could be comprised of dielectrics such as silicon dioxide ($SiO_2$), silicon nitride ($Si_xN_y$), a combination thereof or other dielectric materials. Further, the mask layer could be comprised of metal layers such as Ni or Cr, but could be comprised of metal combination stacks or stacks comprising metal and dielectrics. In another approach, photoresist masks can be used either alone or in combination with dielectrics and/or metals. The etch mask layer is patterned using conventional photolithography and etch steps. The alignment lithography could be performed with a contact aligner or stepper aligner. Such lithographically defined mirrors provide a high level of control to the design engineer. After patterning of the photoresist mask on top of the etch mask is complete, the patterns in then transferred to the etch mask using a wet etch or dry etch technique. Finally, the facet pattern is then etched into the wafer using a dry etching technique selected from CAIBE, ICP, RIE and/or other techniques. The etched facet surfaces must be highly vertical of between about 87 and 93 degrees or between about 89 and 91 degrees from the surface plane of the wafer. The etched facet surface region must be very smooth with root mean square roughness values of less than 50 nm, 20 nm, 5 nm, or 1 nm. Lastly, the etched must be substantially free from damage, which could act as nonradiative recombination centers and hence reduce the COMD threshold. CAIBE is known to provide very smooth and low damage sidewalls due to the chemical nature of the etch, while it can provide highly vertical etches due to the ability to tilt the wafer stage to compensate for any inherent angle in etch.

The laser stripe is characterized by a length and width. The length ranges from about 50 microns to about 3000 microns, but is preferably between 10 microns and 400 microns, between about 400 microns and 800 microns, or about 800 microns and 1600 microns, but could be others. The stripe also has a width ranging from about 0.5 microns to about 50 microns, but is preferably between 0.8 microns and 2.5 microns for single lateral mode operation or between 2.5 um and 35 um for multi-lateral mode operation, but can be other dimensions. In a specific embodiment, the present device has a width ranging from about 0.5 microns to about 1.5 microns, a width ranging from about 1.5 microns to about 3.0 microns, a width ranging from 3.0 microns to about 35 microns, and others. In a specific embodiment, the width is substantially constant in dimension, although there may be slight variations. The width and length are often formed using a masking and etching process, which are commonly used in the art.

The laser stripe is provided by an etching process selected from dry etching or wet etching. The device also has an overlying dielectric region, which exposes a p-type contact region. Overlying the contact region is a contact material, which may be metal or a conductive oxide or a combination thereof. The p-type electrical contact may be deposited by thermal evaporation, electron beam evaporation, electroplating, sputtering, or another suitable technique. Overlying the polished region of the substrate is a second contact material, which may be metal or a conductive oxide or a combination thereof and which comprises the n-type electrical contact. The n-type electrical contact may be deposited by thermal evaporation, electron beam evaporation, electroplating, sputtering, or another suitable technique.

Given the high gallium and nitrogen containing substrate costs, difficulty in scaling up gallium and nitrogen containing substrate size, the inefficiencies inherent in the processing of small wafers, and potential supply limitations on polar, semi-polar, and nonpolar gallium and nitrogen containing wafers, it becomes extremely desirable to maximize utilization of available gallium and nitrogen containing substrate and overlying epitaxial material. In the fabrication of lateral cavity laser diodes, it is typically the case that minimum die size is determined by device components such as the wire bonding pads or mechanical handling considerations, rather than by laser cavity widths. Minimizing die size is critical to reducing manufacturing costs as smaller die sizes allow a greater number of devices to be fabricated on a single wafer in a single processing run. The current invention is a method of maximizing the number of devices which can be fabricated from a given gallium and nitrogen containing substrate and overlying epitaxial material by spreading out the epitaxial material onto a carrier wafer via a die expansion process.

A top down view of one preferred embodiment of the die expansion process is depicted in FIG. 5. The starting materials are patterned epitaxy and carrier wafers. Herein, the 'epitaxy wafer' or 'epitaxial wafer' is defined as the original gallium and nitrogen containing wafer on which the epitaxial material making up the active region was grown, while the 'carrier wafer' is defined as a wafer to which epitaxial layers are transferred for convenience of processing. The carrier wafer can be chosen based on any number of criteria including but not limited to cost, thermal conductivity, thermal expansion coefficients, size, electrical conductivity, optical properties, and processing compatibility. The patterned epitaxy wafer is prepared in such a way as to allow subsequent selective release of bonded epitaxy regions. The patterned carrier wafer is prepared such that bond pads are arranged in order to enable the selective area bonding process. These wafers can be prepared by a variety of process flows, some embodiments of which are described below. In the first selective area bond step, the epitaxy wafer is aligned with the pre-patterned bonding pads on the carrier wafer and a combination of pressure, heat, and/or sonication is used to bond the mesas to the bonding pads. The bonding material can be a variety of media including but not limited to metals, polymers, waxes, and oxides. Only epitaxial die which are in contact with a bond bad on the carrier wafer will bond. Sub-micron alignment tolerances are possible on commercial die bonders. The epitaxy wafer is then pulled away, breaking the epitaxy material at a weakened epitaxial release layer such that the desired epitaxial layers remain on the carrier wafer. Herein, a 'selective area bonding step' is defined as a single iteration of this process. In the example depicted in FIG. 5, one quarter of the epitaxial die are transferred in this first selective bond step, leaving three quarters on the epitaxy wafer. The selective area bonding step is then repeated to transfer the second quarter, third quarter, and fourth quarter of the epitaxial die to the patterned carrier wafer. This selective area bond may be repeated any number of times and is not limited to the four steps depicted in FIG. 5. The result is an array of epitaxial die on the carrier wafer with a wider die pitch than the original die pitch on the epitaxy wafer. The die pitch on the epitaxial wafer will be referred to as pitch 1, and the die pitch on the carrier wafer will be referred to as pitch 2, where pitch 2 is greater than pitch 1. At this point standard laser diode processes can be carried out on the carrier wafer. Side profile views of devices fabricated with state of the art methods and the methods described in the current invention are depicted in FIG. 1 and FIG. 2, respectively. The device structure enabled by the current invention only contains the relatively expensive epitaxy material where the optical cavity requires it, and has the relatively large bonding pads and/or other device components resting on a carrier wafer. Typical dimensions for laser ridge widths and bonding pads are <30 μm and >100 μm, respectively, allowing for three or more times improved epitaxy usage efficiency with the current invention.

There are many methods by which the expanded die pitch can be achieved. One embodiment for the fabrication of GaN based laser diodes is depicted in FIG. 6 and FIG. 7. This embodiment uses a bandgap selective photo-electrical chemical (PEC) etch to undercut an array of mesas etched into the epitaxial layers, followed by a selective area bonding process on a patterned carrier wafer. The preparation of the epitaxy wafer is shown in FIG. 6 and the selective area bonding process is shown in FIG. 7. This process requires the inclusion of a buried sacrificial region, which can be selectively PEC etched by bandgap. For GaN based optoelectronic devices, InGaN quantum wells have been shown to be an effective sacrificial region during PEC etching.[1,2] The first step depicted in FIG. 6 is a top down etch to expose the sacrificial layers, followed by a bonding metal deposition as shown in FIG. 6. With the sacrificial region exposed a bandgap selective PEC etch is used to undercut the mesas. The bandgaps of the sacrificial region and all other layers are chosen such that only the sacrificial region will absorb light, and therefor etch, during the PEC etch. With proper control of etch rates a thin strip of material 107 can be left to weakly connect the mesas to the epitaxy substrate. This wafer is then aligned and bonded to a patterned carrier wafer, as shown in FIG. 7. Gold-gold metallic bonding is used as an example in this work, although a wide variety of oxide bonds, polymer bonds, wax bonds etc. are potentially suitable. Submicron alignment tolerances are possible using commercial available die bonding equipment. The carrier wafer is patterned in such a way that only selected mesas come in contact with the metallic bond pads on the carrier wafer. When the epitaxy substrate is pulled away the bonded mesas break off at the weakened sacrificial region and a portion 111 of the mesas remain intact on the carrier wafer, while the unbonded mesas remain attached to the epitaxy substrate. This selective area bonding process can then be repeated to transfer the remaining mesas in the desired configuration. This process can be repeated through any number of iterations and is not limited to the two iterations depicted in FIG. 7. The carrier wafer can be of any size, including but not limited to 2 inch, 3 inch, 4 inch, 6 inch, 8 inch, and 12 inch. After all desired mesas have been transferred, a second bandgap selective PEC etch can be optionally used to remove any remaining sacrificial region material to yield smooth surfaces. At this point standard laser diode processes can be carried out on the carrier wafer.

Another embodiment of the invention uses a sacrificial region with a higher bandgap than the active region such that both layers are absorbing during the bandgap PEC etching process. In this embodiment, the active region can be prevented from etching during the bandgap selective PEC etch using an insulating protective layer on the sidewall, as shown in FIG. 8. The first step depicted in FIG. 8 is an etch to expose the active region of the device. This step is followed by the deposition of a protective insulating layer on the mesa sidewalls, which serves to block PEC etching of the active region during the later sacrificial region undercut PEC etching step. A second top down etch is then performed to expose the sacrificial layers and bonding metal is deposited as shown in FIG. 8. With the sacrificial region exposed a bandgap selective PEC etch is used to undercut the mesas. At this point, the selective area bonding process shown in FIG. 7 is used to continue fabricating devices.

Another embodiment of the invention incorporates the fabrication of device components on the dense epitaxy wafers before the selective area bonding steps. In the embodiment depicted in FIG. 9 the laser ridge, sidewall passivation, and contact metal are fabricated on the original epitaxial wafer before the die expansion process. This process flow is given for example purposes only and is not meant to limit which device components can be processed before the die expansion process. This work flow has potential cost advantages since additional steps are performed on the higher density epitaxial wafer before the die expansion process. A detailed schematic of this process flow is depicted in FIG. 9.

In another preferred embodiment of the invention the gallium and nitrogen epitaxial material will be grown on a gallium and nitrogen containing substrate material of one of the following orientations: m-plane, {50-51}, {30-31}, {20-21}, {30-32}, {50-5-1}, {30-3-1}, {20-2-1}, {30-3-2}, or offcuts of these planes within +/−5 degrees towards a-plane and/or c-plane In another embodiment of the invention individual PEC undercut etches are used after each selective bonding step for etching away the sacrificial release layer of only bonded mesas. Which epitaxial die get undercut is controlled by only etching down to expose the sacrificial layer of mesas which are to be removed on the current selective bonding step. The advantage of this embodiment is that only a very coarse control of PEC etch rates is required. This comes at the cost of additional processing steps and geometry constrains.

In another embodiment of the invention the bonding layers can be a variety of bonding pairs including metal-metal, oxide-oxide, soldering alloys, photoresists, polymers, wax, etc.

In another embodiment of the invention the sacrificial region is completely removed by PEC etching and the mesa remains anchored in place by any remaining defect pillars. PEC etching is known to leave intact material around defects which act as recombination centers.[2,3] Additional mechanisms by which a mesa could remain in place after a complete sacrificial etch include static forces or Van der Waals forces.

In another embodiment of the invention a shaped sacrificial region expose mesa is etched to leave larger regions near the ends of each epitaxy die. Bonding metal is placed only on the regions of epitaxy that are to be transferred. A PEC etch is then performed such that the epitaxy die to be transferred is completely undercut while the larger regions near the end are only partially undercut. The intact sacrificial regions at the ends of the die provide mechanical stability through the selective area bonding step. As only a few nanometers of thickness will be undercut, this geometry should be compatible with standard bonding processes. After the selective area bonding step, the epitaxy and carrier wafers are mechanically separated, cleaving at the weak points between the bond metal and intact sacrificial regions. Example schematics of this process are depicted in FIGS. 10 and 11. After the desired number of repetitions is completed, state of the art laser diode fabrication procedures can be applied to the die expanded carrier wafer.

In another embodiment of the invention, the release of the epitaxial layers is accomplished by means other than PEC etching, such as laser lift off.

In another embodiment of the invention the carrier wafer is another semiconductor material, a metallic material, or a ceramic material. Some potential candidates include silicon, gallium arsenide, sapphire, silicon carbide, diamond, gallium nitride, AlN, polycrystalline AlN, indium phosphide, germanium, quartz, copper, gold, silver, aluminum, stainless steel, or steel.

In another embodiment of the invention the laser facets are produced by cleaving processes. If a suitable carrier wafer is selected it is possible to use the carrier wafer to define cleaving planes in the epitaxy material. This could improve the yield, quality, ease, and/or accuracy of the cleaves.

In another embodiment of the invention the laser facets are produced by etched facet processes. In the etched facet embodiment a lithographically defined mirror pattern is etched into the gallium and nitrogen to form facets. The etch process could be a dry etch process selected from inductively coupled plasma etching (ICP), chemically assisted ion beam etching (CAIBE), or reactive ion etching (ME) Etched facet process can be used in combination with the die expansion process to avoid facet formation by cleaving, potentially improved yield and facet quality.

In another embodiment of the invention die singulation is achieved by cleaving processes which are assisted by the choice of carrier wafer. For example, if a silicon or GaAs carrier wafer is selected there will be a system of convenient cubic cleave planes available for die singulation by cleaving. In this embodiment there is no need for the cleaves to transfer to the epitaxy material since the die singulation will occur in the carrier wafer material regions only.

In another embodiment of the invention any of the above process flows can be used in combination with the wafer tiling. As an example, 7.5 mm by 18 mm substrates can be tiled onto a 2 inch carrier wafer, allowing topside processing and selective area bonding to be carried out on multiple epitaxy substrates in parallel for further cost savings.

In another embodiment of the invention the substrate wafer is reclaimed after the selective area bond steps through a re-planarization and surface preparation procedure. The epitaxy wafer can be reused any practical number of times.[6]

In an example, the present invention provides a method for increasing the number of gallium and nitrogen containing laser diode devices which can be fabricated from a given epitaxial surface area; where the gallium and nitrogen containing epitaxial layers overlay gallium and nitrogen containing substrates. The epitaxial material comprises of at least the following layers: a sacrificial region which can be selectively etched using a bandgap selective PEC etch, an n-type cladding region, an active region comprising of at least one active layer overlying the n-type cladding region, and a p-type cladding region overlying the active layer region. The gallium and nitrogen containing epitaxial material is patterned into die with a first die pitch; the die from the gallium and nitrogen containing epitaxial material with a first pitch is transferred to a carrier wafer to form a second die pitch on the carrier wafer; the second die pitch is larger than the first die pitch.

In an example, each epitaxial die is an etched mesa with a pitch of between 1 μm and 10 μm wide or between 10 micron and 50 microns wide and between 50 and 3000 μm long. In an example, the second die pitch on the carrier wafer is between 100 microns and 200 microns or between 200 microns and 300 microns. In an example, the second die pitch on the carrier wafer is between 2 times and 50 times larger than the die pitch on the epitaxy wafer. In an example, semiconductor laser devices are fabricated on the carrier wafer after epitaxial transfer. In an example, the semiconductor devices contain GaN, AlN, InN, InGaN, AlGaN, InAlN, and/or InAlGaN. In an example, the gallium and nitrogen containing material are grown on a polar, non-polar, or semi-polar plane. In an example, one or multiple laser diode cavities are fabricated on each die of epitaxial material. In an example, device components, which do not require epitaxy material are placed in the space between epitaxy die.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k l) plane wherein l=0, and at least one of h and k is non-zero).

As shown, the present device can be enclosed in a suitable package. Such package can include those such as in TO-38 and TO-56 headers. Other suitable package designs and methods can also exist, such as TO-9 or flat packs where fiber optic coupling is required and even non-standard packaging. In a specific embodiment, the present device can be implemented in a co-packaging configuration.

In other embodiments, the present laser device can be configured in a variety of applications. Such applications include laser displays, metrology, communications, health care and surgery, information technology, and others. As an example, the present laser device can be provided in a laser display such as those described in U.S. Ser. No. 12/789,303 filed May 27th, 2010, which claims priority to U.S. Provisional No. 61/182,105 filed May 29, 2009 and 61/182,106 filed May 29, 2009, each of which is hereby incorporated by reference herein.

In an example, the present techniques can be used in conjunction with "Semiconductor Laser Diode on Tiled Gallium Containing Material," listed under U.S. Ser. No. 14/175,622, filed Feb. 7, 2014, commonly assigned, and hereby incorporated by reference herein. In an example, the present techniques can be used with the tiling technique for processing small GaN wafers prior to transfer of GaN epi to carrier wafer for low cost, high volume small GaN wafers.

In an alternative example, the present technique can also be used in conjunction with a double ITO and cleaving technique titled "Gallium and Nitrogen Containing Laser Device Having Confinement Region," which is described in U.S. Ser. No. 61/892,981, filed Oct. 18, 2013, commonly assigned, and hereby incorporated by reference herein. That is, the present technique can be integrated with the double clad and cleaving technology.

While the above is a full description of the specific embodiments, various modifications, alternative constructions and equivalents may be used. As an example, the packaged device can include any combination of elements described above, as well as outside of the present specification. As used herein, the term "substrate" can mean the bulk substrate or can include overlying growth structures such as a gallium and nitrogen containing epitaxial region, or functional regions such as n-type GaN, combinations, and the like. Additionally, the examples illustrates two waveguide structures in normal configurations, there can be variations, e.g., other angles and polarizations. For semipolar, the present method and structure includes a stripe oriented perpendicular to the c-axis, an in-plane polarized mode is not an Eigen-mode of the waveguide. The polarization rotates to elliptic (if the crystal angle is not exactly 45 degrees, in that special case the polarization would rotate but be linear, like in a half-wave plate). The polarization will of course not rotate toward the propagation direction, which has no interaction with the Al band. The length of the a-axis stripe determines which polarization comes out at the next mirror. Although the embodiments above have been described in terms of a laser diode, the methods and device structures can also be applied to any light emitting diode device. Therefore, the above description and illustrations should not be taken as limiting the scope of the present invention which is defined by the appended claims.

REFERENCES

1. Holder, C., Speck, J. S., DenBaars, S. P., Nakamura, S. & Feezell, D. Demonstration of Nonpolar GaN-Based Vertical-Cavity Surface-Emitting Lasers. *Appl. Phys. Express* 5, 092104 (2012).
2. Tamboli, A. Photoelectrochemical etching of gallium nitride for high quality optical devices. (2009). at <http://adsabs.harvard.edu/abs/2009PhDT . . . 68T>
3. Yang, B. MICROMACHINING OF GaN USING PHOTOELECTROCHEMICAL ETCHING. (2005).
4. Sink, R. Cleaved-Facet Group-III Nitride Lasers. (2000). at <http://siliconphotonics.ece.ucsb.edu/sites/default/files/publications/2000 Cleaved-Faced Group-III Nitride Lasers.PDF>
5. Bowers, J., Sink, R. & Denbaars, S. Method for making cleaved facets for lasers fabricated with gallium nitride and other noncubic materials. U.S. Pat. No. 5,985,687 (1999). at <http://www.google.com/patents?hl=en&lr=&vid=USPAT5985687&id=no8XAA AAEBAJ& oi=fnd&dq=Method+for+making+cleaved+facets+for+lasers+fabricated+with+gallium+nit ride+and+other+noncubic+materials&printsec=abstract>
6. Holder, C. O., Feezell, D. F., Denbaars, S. P. & Nakamura, S. Method for the reuse of gallium nitride epitaxial substrates. (2012).

What is claimed is:

1. A method for manufacturing an article using a gallium and nitrogen containing laser diode device, the method comprising:
   providing a gallium and nitrogen containing substrate having a surface region;
   forming epitaxial material overlying the surface region, the epitaxial material comprising an n-type cladding region, an active region comprising of at least one active layer overlying the n-type cladding region, and a p-type cladding region overlying the active layer region;
   patterning the epitaxial material to form a plurality of dies, each of the dies corresponding to at least one laser device, characterized by a first pitch between a pair of dies, the first pitch being less than a design width;
   transferring at least a portion of the plurality of dies to a carrier wafer such that each pair of transferred dies is configured with a second pitch between each pair of dies, the second pitch being larger than the first pitch and corresponding to the design width, the transferring comprising:
     selectively removing at least a portion of a release region of one or more dies while leaving an anchor region intact between the one or more dies and the gallium and nitrogen containing substrate,
     selectively bonding the one or more dies to the carrier wafer,
     releasing the one or more dies from the gallium and nitrogen containing substrate by separating the anchor region associated with each of the one or more dies while a portion of the epitaxial material remains bonded to the carrier wafer; and
   using at least one of the dies in an application selected from at least one of a laser display or a light.

2. The method of claim 1, wherein each die is shaped as a mesa, and each pair of dies having the first pitch ranging between 1 μm and 10 μm or between 10 μm and 50 μm wide or between 50 μm and 3000 μm long; the patterning comprising an etching process; and the second pitch on the carrier wafer is between 100 μm and 200 μm or between 200 μm and 300 μm.

3. The method of claim 1, wherein the second pitch on the carrier wafer is between 2 times and 50 times larger than the first pitch.

4. The method of claim 1, further comprising processing each of the dies to form at least one laser device on each die after the transferring or further comprising forming one or multiple laser diode cavities on each die of epitaxial material.

5. The method of claim 1, wherein each pair of dies overlying the carrier wafer is defined by the second pitch; and further comprising forming one or more components overlying a space defined by the second pitch, the one or more components being selected from a contact region or a bonding pad.

6. The method of claim 1, wherein the carrier wafer is characterized by a conductive material for a contact region or contact regions; wherein each of the laser devices is characterized by a wavelength ranging between 200 and 2000 nm; and wherein each of the laser device comprising a pair of facets configured from a cleaving process or an etching process, the etching process being selected from inductively coupled plasma etching, chemical assisted ion beam etching, or reactive ion beam etching.

7. The method of claim 1, further comprising singulating each of the dies by separating each pair of dies at a space defined by the second pitch; wherein the epitaxial material contains GaN, AlN, InN, InGaN, AlGaN, InAlN, and/or InAlGaN; and wherein the carrier wafer comprises at least one of silicon, gallium arsenide, sapphire, silicon carbide, diamond, gallium nitride, AlN, indium phosphide, or metallic.

8. The method of claim 1, wherein the selectively bonding comprises bonding each of the one or more dies to a bonding pad on the carrier wafer.

9. The method of claim 1, wherein the transferring is repeated N times to transfer one or more other dies to the carrier wafer, where N is an integer between 1 and 50.

10. The method of claim 1, wherein the transferring is repeated N times to transfer one or more other dies to the carrier wafer, where N is an integer between 1 and 50 to remove each of the dies to be bonded to the carrier wafer; whereupon the carrier wafer has a larger diameter than a diameter of the gallium and nitrogen containing substrate.

11. The method of claim 1 wherein the transferring is repeated N times to transfer one or more other dies to the carrier wafer, where N is an integer between 1 and 50 to remove each of the dies to be bonded to the carrier wafer; whereupon the carrier wafer has a larger diameter than a diameter of the gallium and nitrogen containing substrate; whereupon bonds between each of the one or more dies and the carrier wafer comprise at least one of metal-metal pairs, oxide-oxide pairs, spin-on-glass, soldering alloys, polymers, photoresists, and/or wax.

12. The method of claim 1, wherein the transferring is repeated N times to transfer one or more other dies to the carrier wafer, where N is an integer between 1 and 50 to remove each of the dies to be bonded to the carrier wafer; whereupon the carrier wafer has a larger diameter than a diameter of the gallium and nitrogen containing substrate; whereupon bonds between each of the one or more dies and the carrier wafer comprise at least one of metal-metal pairs, oxide-oxide pairs, spin-on-glass, soldering alloys, polymers, photoresists, and/or wax; and wherein the selectively removing uses a bandgap selective photo-electrical-chemical (PEC) etching to remove the portion of the release region.

13. The method of claim 12, wherein the PEC etching selectively removes substantially all of the release region while leaving intact a portion of the release region to provide structure during the selectively bonding, the portion of the release region forming the anchor region.

14. The method of claim 12, wherein the PEC etching selectively removes the release region while leaving the anchor region in tact to support the dies during the selective bonding, and wherein each of the one or more dies comprises a passivation region for protection from PEC etching.

15. The method of claim 12, wherein the PEC etching selectively removes the release region while leaving the anchor region intact to support the dies during the selective bonding, the anchor region comprising a defect pillar, a static force, or a Van der Waals force.

16. The method of claim 12, further comprising an additional PEC etching process to completely remove remaining portions of the release region on the one or more dies while the one or more dies are bonded to the carrier wafer.

17. The method of claim 12, further comprising forming a metal material overlying the one or more dies before transferring, while leaving exposed one or more anchor regions, which are configured to selectively break and separate from each of the dies after selectively bonding.

18. The method of claim 1, wherein the release region is composed of a material with a smaller bandgap than an adjacent epitaxial layer.

19. The method of claim 1, wherein the release region is composed of InGaN, InN, InAlN, or InAlGaN.

20. The method of claim 1, wherein the selectively removing forms an undercut region within a vicinity of each of the one or more dies to enable selective release of each of the one or more dies.

* * * * *